United States Patent [19]

Watabe et al.

[11] Patent Number: 5,217,913
[45] Date of Patent: Jun. 8, 1993

[54] METHOD OF MANUFACTURING AN MIS DEVICE HAVING LIGHTLY DOPED DRAIN STRUCTURE AND CONDUCTIVE SIDEWALL SPACERS

[75] Inventors: Kiyoto Watabe; Katsuyoshi Mitsui; Masahide Inuishi, all of Hyogo, Japan

[73] Assignee: Mitsubishi Denki Kabushiki Kaisha, Tokyo, Japan

[21] Appl. No.: 896,535

[22] Filed: Jun. 9, 1992

Related U.S. Application Data

[62] Division of Ser. No. 399,947, Aug. 31, 1989, Pat. No. 5,146,291.

[30] Foreign Application Priority Data

| Aug. 31, 1988 | [JP] | Japan | 63-217623 |
| Sep. 16, 1988 | [JP] | Japan | 63-233218 |
| Oct. 5, 1988 | [JP] | Japan | 63-251113 |
| Dec. 5, 1988 | [JP] | Japan | 63-308072 |

[51] Int. Cl.$^5$ ............... H01L 21/336; H01L 21/265; H01L 29/784
[52] U.S. Cl. ................. 437/44; 437/979; 437/984
[58] Field of Search .......... 437/40, 41, 44, 27, 437/28, 29, 30, 186, 913, 984, 979; 357/23.3

[56] References Cited

U.S. PATENT DOCUMENTS

| 4,049,477 | 9/1977 | Ligon | 437/979 |
| 4,520,553 | 6/1985 | Kraft | 437/979 |
| 4,727,038 | 8/1988 | Watabe et al. | |
| 4,925,807 | 5/1990 | Yoshikawa | 437/44 |
| 4,952,993 | 8/1990 | Okumura | |
| 4,954,867 | 9/1990 | Hosaka | |
| 4,978,628 | 12/1990 | Rosenthal | |

FOREIGN PATENT DOCUMENTS

| 55-53461 | 4/1980 | Japan |
| 60-229374 | 11/1985 | Japan |
| 60-235471 | 11/1985 | Japan |
| 60-261171 | 12/1985 | Japan |
| 61-36975 | 2/1986 | Japan |

(List continued on next page.)

OTHER PUBLICATIONS

Paul J. Tsang et al. "Fabrication of High-Performance LDDFET's Oxide Sidewall Sidewall-Spacer Technology," IEEE Transactions on Electron Devices, vol. EL-29, No. 4, Apr. 1982, pp. 590-596.

Ryuichi Izawa et al. "The Impact of Gate-Drain Overlapped LDD (Gold) for Deep Submicron VLSI's", IEEE Central Research Laboratory, Hitachi Ltd., Kokubunju, Tokyo 1895, Japan, 1987, pp. 38-41.

Primary Examiner—Mary Wilczewski
Attorney, Agent, or Firm—Lowe, Price, LeBlanc & Becker

[57] ABSTRACT

A MOS FET comprises a pair of source and drain impurity regions, a gate oxide film and a gate electrode. The source and drain regions have an LDD structure in which high concentration impurity regions and low concentration impurity regions are set off. The gate electrode is formed to extend over the channel region and contains sidewalls overlying the low concentration impurity regions. In addition, portions of the gate oxide film located between the sidewalls of the gate electrode and the respective low concentration impurity regions are formed to have a film thickness larger than that of the portion located between the gate electrode and the channel region. The thick portion of the oxide film underlying the gate sidewalls form a charge storage layer which reduces the resistance of the low impurity concentration region while minimizing the gate capacitance. In another example, conductive sidewall spacers are formed on sidewalls of a gate electrode through an insulating film. The sidewall spacers are connected with source and drain electrode connections or directly with source and drain impurity regions. Hot carriers generated near the drain are taken out from a gate insulating layer through conductive sidewall spacers. Accordingly, increase of the resistance due to trapped hot carriers can be prevented.

4 Claims, 29 Drawing Sheets

FOREIGN PATENT DOCUMENTS

| | | |
|---|---|---|
| 61-119078 | 6/1986 | Japan . |
| 61-201471 | 9/1986 | Japan . |
| 61-201472 | 9/1986 | Japan . |
| 61-201475 | 9/1986 | Japan . |
| 61-258475 | 11/1986 | Japan . |
| 62-49665 | 3/1987 | Japan . |
| 62-160770 | 7/1987 | Japan . |
| 63-44770 | 2/1988 | Japan . |
| 61-201473 | 4/1988 | Japan . |
| 63-168050 | 7/1988 | Japan . |
| 64-764 | 1/1989 | Japan . |
| 2-137335 | 5/1990 | Japan ................................. 437/44 |
| 3-127837 | 5/1991 | Japan ................................. 437/44 |

L1 : CARRIER DISTRIBUTION
L2 : N TYPE IMPURITY CONCENTRATION
L3 : P TYPE IMPURITY CONCENTRATION
W : LENGTH OF N⁻ DIFFUSION REGION

DISTANCE FROM GATE OF SOURCE (μm)

(SOURCE→CHANNEL)

METHOD OF MANUFACTURING AN MIS DEVICE HAVING LIGHTLY DOPED DRAIN STRUCTURE AND CONDUCTIVE SIDEWALL SPACERS

This application is a division of application Ser. No. 07/399,947 filed Aug. 31, 1989, now U.S. Pat. No. 5,146,291.

BACKGROUND OF THE INVENTION

1. Field of the Invention

The present invention relates to MIS (metal insulator semiconductor) transistors and particularly to an MIS transistor having an LDD (lightly doped drain) structure and a method of manufacturing thereof.

2. Description of the Prior Art

In order to accomplish large scale integration and high reliability of semiconductor apparatus, it is indispensably necessary to reduce semiconductor devices of a semiconductor apparatus to microscopic sizes or to enhance performance thereof. A typical example of a semiconductor device is a MOS (metal oxide semiconductor) transistor as shown in FIG. 32. Referring to FIG. 32, a MOS transistor 1 comprises a gate electrode 4 of polysilicon or the like through a thin gate oxide film 3 on a surface of a silicon substrate 2. A pair of source and drain regions 5 and 6 are formed spaced from each other on the surface of the silicon substrate 2 with a gate electrode 4 being provided therebetween. A surface region of the silicon substrate 2 located between the source and drain regions 5 and 6 constitutes a channel region 7 of the MOS transistor 1.

The size of the MOS transistor 1 is reduced according to a scaling rule in order to realize a miniaturized structure without deteriorating the electric characteristics of the transistor. Thus, in this structure, a gate length of the gate electrode 4 or a channel length of the channel region 7 for example is reduced. However, this reduction of the structure involves a problem of a short channel effect which does not occur conspicuously in the prior art. More specifically, the reduction of the channel length causes concentration of an electric field near the drain region 6, resulting in deterioration of dielectric strength of the drain region. In addition, hot carriers generated by the concentration of electric field penetrate into the gate oxide films 3 and part of them are trapped or cause an interfacial potential. As a result, characteristic deteriorations such as a change of a threshold voltage $V_{TH}$ or lowering of mutual conductance gm occur.

In order to solve such difficulties due to concentration of electric field obstructing fine reduction of a device structure, MOS transistors of an LDD structure have been proposed. FIG. 33 shows a structure of such an LDD MOS transistor. This structure of the LDD MOS transistor is shown for example in "Fabrication of High-Performance LDD FETs with Oxide Sidewall-Spacer Technology" by P. J. Tsang, IEEE Transaction on Electron Devices, Vol. ED-29 1982. Referring to FIG. 33, the LDD MOS transistor has a double offset structure in which source and drain regions 5 and 6 include high-concentration $n^+$ impurity regions 5a and 6a and low-concentration $n^-$ impurity regions 5b and 6b, respectively. This LDD structure is adopted particularly for the purpose of suppressing electric field concentration near the drain region 6. The $n^-$ impurity regions 5b and 6b are formed on side surfaces of the source and drain regions 5a and 6a, respectively, so that impurity concentrations in pn junction portions with the substrate may be changed gradually. Thus, a depletion layer generated during operation of the transistor extends toward the source and drain regions to attenuate electric field. The above described structure prevents breakdown between the drain region 6 and the channel region 7 and thus prevents deterioration of dielectric strength of the drain region 6. Further, the attenuation of electric field concentration serves to suppress generation of hot carriers. However, in the above described LDD structure, another problem occurs that an on-resistance characteristic of the transistor is deteriorated. The low-concentration $n^-$ impurity regions 5b and 6b of the source and drain regions function as high-resistance regions because of the low impurity concentration. Consequently, the $n^-$ impurity regions 5b and 6b become parasitic resistances connected in series between the source and drain regions 5 and 6, causing lowering of drain current and deterioration of the on-resistance characteristic of the transistor.

Further, the influence of the parasitic resistance is strengthened by the structure in which the sidewalls 8 of the silicon oxide films are formed on the surfaces of the low-concentration $n^-$ source and drain regions 5b and 6b. More specifically, hot carriers having larger energy than that in a thermal equilibrium state are generated due to the electric field near the drain region 6. Those hot carriers are generated near the $n^-$ impurity region 6b of the drain region and some of them are injected in a lower portion of the sidewall 8 of the drain region. A surface region near the $n^-$ impurity region 6b is depleted with time due to an electric field caused by the hot carriers trapped at an energy level in the underlying oxide film of the sidewall 8. As a result, the threshold voltage $V_{TH}$ of the transistor is raised or conductance is decreased due to the depleted high-resistance portion of the $n^-$ impurity region 6b even in an operation state. Consequently, the drain characteristics are deteriorated and duration of reliability of the transistor practically utilizable is shortened.

Therefore, in order to prevent influence of hot carriers trapped in the sidewalls of the gate electrode, a transistor structure as shown in FIG. 34 has been proposed. This structure is the so-called gate overlapped LDD structure, in which a gate electrode is formed to overlap low-concentration impurity regions of the LDD structure. The structure of FIG. 34 is indicated in Japanese Patent Laying-Open No. 119078/1986. A transistor of a similar structure is disclosed in "The Impact of Gate-Drain Overlapped LDD (Gold) for Deep Submicron VLSI's", by R. Izawa, Technical Digest of International Electron Devices Meeting, pp. 38, 1987 or in U.S. Pat. No. 4,727,038.

As shown in FIG. 34, in a gate overlapped LDD MOS transistor, low-concentration $n^-$ impurity regions 5b and 6b of source and drain regions 5 and 6 are formed on a surface of a silicon substrate 2 under regions of a gate electrode 4. In such a gate electrode structure, if hot carriers generated near the drain 6 are injected into a gate oxide film 3, those hot carriers can be removed under the influence of electric field from the gate electrode 4. Consequently, the surfaces of the $n^-$ impurity regions 5b and 6b can be prevented from being depleted and having high resistance. Further, change in a threshold voltage and deterioration of mutual conductance can be prevented.

However, in such a gate overlapped LDD MOS transistor, a gate capacitance is increased by an amount corresponding to extended regions of the gate electrode 4 compared with the LDD MOS transistor shown in FIG. 33. In other words, the capacitance portion formed by the gate electrode 4 over the n⁻ impurity regions 5b and 6b, the gate oxide film 3 and the silicon substrate 2 causes the increase of the gate capacitance. As the result, responsiveness as the MOS transistor is lowered.

In a gate overlapped type of LDD MOS transistor, in some cases, boundary portions between n⁺ impurity regions 5a, 6a and n⁻ impurity regions 5b and 6b are diffused under the gate electrode 4 by a thermal process of the manufacturing processes. In this case, regions where the end portions of the gate electrode 4 and the n⁺ impurity regions 5a and 6a are overlapped are formed. When thickness of the gate oxidization layer 3 becomes thin in such an overlapped region, tunneling occurs between the bands in a depleted drain region, whereby drain leak current is generated. Such a phenomenon is described in "IEDM Technical Digest", by T. Y. Chan, J. Chen, P. K. Ko and C. Hu, 1987.

As described in the foregoing, in conventional LDD MIS transistors, n⁻ impurity regions become parasitic resistance due to hot carriers and gate capacitance generated in a gate overlapped type of LDD structure is increased or a drain leak current is generated.

SUMMARY OF THE INVENTION

An object of the present invention is to improve the transistor characteristics of an MIS device having a miniaturized structure.

Another object of the present invention is to improve the on-resistance characteristic of an MIS device.

Another object of the present invention is to improve responsiveness of an MIS device.

A further object of the present invention is to improve duration of reliability of an MIS device having a miniaturized structure.

A further object of the present invention is to provide a method of manufacturing an MIS device of a fine structure having excellent on-resistance characteristic.

A further object of the present invention is to provide an MIS device having operating characteristics remaining stable over time.

A further object of the present invention is to provide a method of manufacturing an LDD MIS device in which a drain leak current is decreased.

A further object of the present invention is to provide a method of manufacturing an LDD MIS device in which deterioration of reliability caused by hot carriers can be prevented.

A further object of the present invention is to provide a method of manufacturing an LDD MIS device having conductive sidewall spacers on sidewalls of a gate.

According to the first aspect of the present invention, the first conductive layer extends on the surface of the impurity region of the low concentration of the LDD structure through the insulating film. Thus, a voltage applied to the first conductive layer exerts influence on the impurity region of the low concentration to form a charge storage layer on the surface of this impurity region. This charge storage layer lowers resistance of the impurity region of the low concentration, thereby to increase current of the MIS device.

The thickness of the insulating film on the surface of the impurity region of the low concentration is sufficiently large to form the charge storage layer on the surface of this impurity region and to reduce the capacitance formed by the first conductive layer, the insulating film and the semiconductor substrate. Thus, rapid responsiveness of the MIS device is achieved.

According to the second aspect of the invention, the insulating film is formed by a thermal oxidation process utilizing oxidation resistant property of the nitride film. The insulating film formed by the thermal oxidation process is of a good quality and has little defect and trap of charge hardly occurs. Consequently, adverse effect to due to trap of hot carriers injected in the insulating film can be reduced.

According to the third aspect of the present invention, low-concentration impurity regions of the LDD structure are formed by an oblique ion implantation using a gate electrode layer as a mask, while high-concentration impurity regions are formed by a vertical ion implantation using insulating layer sidewall spacers formed on sidewalls of the gate electrode layer as a mask. Thus, the low-concentration impurity regions are formed with most part of them extending under the gate electrode layer. The so-called gate overlapped structure prevents depletion of the low-concentration impurity regions so as to suppress increase of parasitic resistance. Boundary surfaces between the low-concentration impurity region and the high-concentration impurity region are located outside of the end portions of the gate electrode layer, whereby generation of a drain leak current is suppressed.

According to the fourth aspect of the present invention, conductive sidewall spacers insulated from the gate electrode layer through the insulating film are formed on the low-concentration impurity regions of the LDD structure. The high-concentration impurity regions are formed in the semiconductor substrate using the conductive sidewall spacers as a mask. The conductive sidewall spacers are connected in the same contact holes to the electrode connection layer connected to the high-concentration impurity regions. Accordingly, a potential of the conductive sidewall spacers is the same as that of the high-concentration impurity regions. Thus, hot carriers injected into the gate insulation are taken out to the electrode connection layer through the conductive sidewall spacers.

According to the fifth aspect of the present invention, conductive sidewall spacers are formed on the sidewalls of the gate electrode layer through the insulating film. The conductive sidewall spacers are at least connected with the surfaces of the low-concentration impurity regions of the LDD structure. The high-concentration impurity regions are formed in the semiconductor substrate using the conductive sidewall spacers as a mask. A potential of the conductive sidewall spacers is set to that of the impurity regions connected therewith. Hot carriers generated during operation of an MIS semiconductor device are taken out through the conductive sidewall spacers.

In addition, the conductive sidewall spacers extend along the sidewalls of the gate electric layer to be connected with impurity regions of other adjacent semiconductor devices. Accordingly, the conductive sidewall spacers function as a connection layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is an illustration for explaining operation in a pentode region and FIG. 2B is an illustration for explaining operation in a triode region.

FIG. 18D is a sectional view taken along the line A-A of FIG. 18.

FIGS. 19 and 20A through 20C are sectional views showing steps of a method of manufacturing the LDD MOS transistor shown in FIG. 9.

DESCRIPTION OF THE PREFERRED EMBODIMENTS

An embodiment of the present invention will be described in detail in the following with reference to the drawings.

Figure 1:
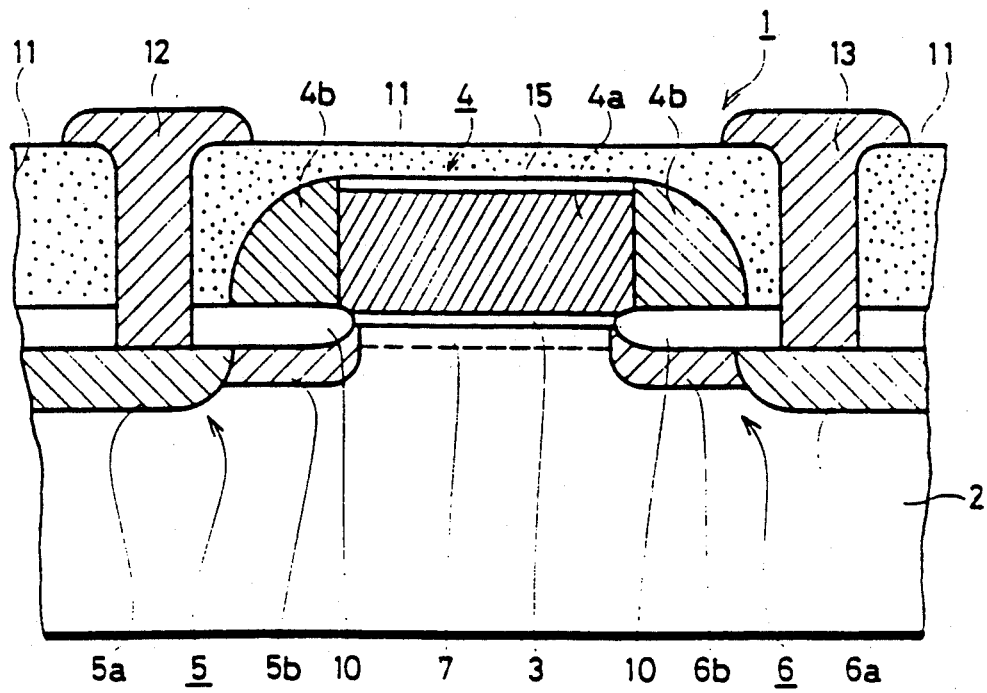
FIG. 1 is a sectional structural view of an LDD MOS transistor according to an embodiment of the present invention.

A first embodiment is described hereinafter with reference to FIG. 1. The MOS transistor 1 comprises source and drain impurity regions 5 and 6 formed with a spacing on a surface of a p type silicon substrate 2. The source and drain regions 5 and 6 are of a so-called LDD structure in which $n^+$ impurity regions 5a and 6a of a relatively high concentration and $n^-$ impurity regions 5b and 6b of a relatively low concentration connected thereto are offset. A surface region of the silicon substrate 2 located between the pair of $n^-$ impurity regions 5b and 6b constitute a channel region 7 of the transistor. A gate oxide film 3 is formed on a surface of the channel region 7 of the silicon substrate 2. Further, an oxide film 10 (referred to hereinafter as a gate overlapped oxide film) having a thickness larger than that of the gate oxide film 3 is formed contiguously to the gate oxide film 3 on surfaces of the $n^-$ impurity regions 5b and 6b. Further, a gate electrode 4 of polysilicon is formed on surfaces of the gate oxide film 3 and the gate overlapped oxide film 10. The gate electrode 4 comprises a main portion 4a having a nearly rectangular section and a sidewall portion 4b formed on sidewalls of the main portion 4a. The gate electrode 4 is formed of polysilicon, the main portion 4a being formed on the surface of the gate oxide film 3 and the sidewall portion 4b being formed on the surfaces of the n− impurity regions 5b and 6b through the gate overlapped oxide film 10. A thick interlayer insulating film 11 is formed over the gate electrode 4 and the surfaces of the gate overlapped oxide film 10. Further, a source electrode connection 12 and a drain electrode connection 13 are connected with the n+ source region 5a and the n+ drain region 6a, respectively, through contact holes formed in the interlayer insulating film 11.

Now, operation of the MOS transistor 1 of this embodiment will be described.

Figure 2A:
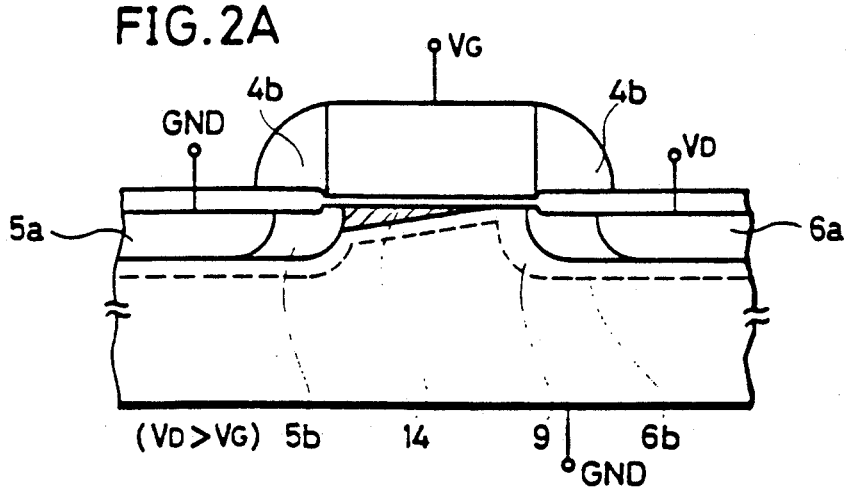
FIGS. 2A and 2B are typical sectional views for explaining operation of the LDD MOS transistor shown in FIG. 1.

As shown in FIG. 2A, an inversion layer 14 is formed mainly on the side of the source region 5 in a pentode region in which a drain voltage $VD_D$ is larger than a gate voltage $V_G$. Consequently, a charge storage layer due to electric field from the sidewall portion 4b of the gate electrode 4 is formed near the gate overlapped oxide film 10 of the n− impurity region 5b on the side of the source region. This charge storage layer serves to decrease parasitic resistance of the n− impurity region 5b.

Figure 2B:
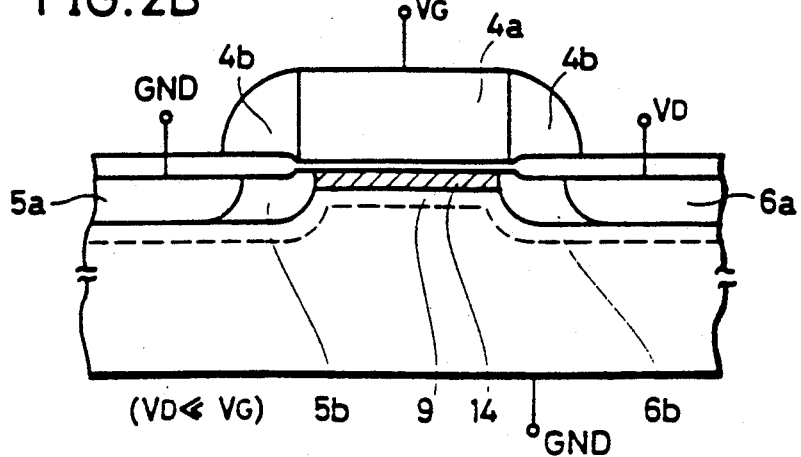

In addition, as shown in FIG. 2B, an inversion layer is formed on both sides of the source and drain regions in a triode region in which the drain voltage $V_D$ is sufficiently smaller than the gate voltage $V_G$. Consequently, a charge storage layer is formed near the gate overlapped oxide film 10 in both of the n− impurity regions 5b and 6b of the source and drain regions due to electric field from the sidewall portion 4b of the gate electrode on both sides of the source and drain regions 5 and 6. Accordingly, the respective parasitic resistances of the n− impurity regions 5b and 6b are decreased.

Figure 3:
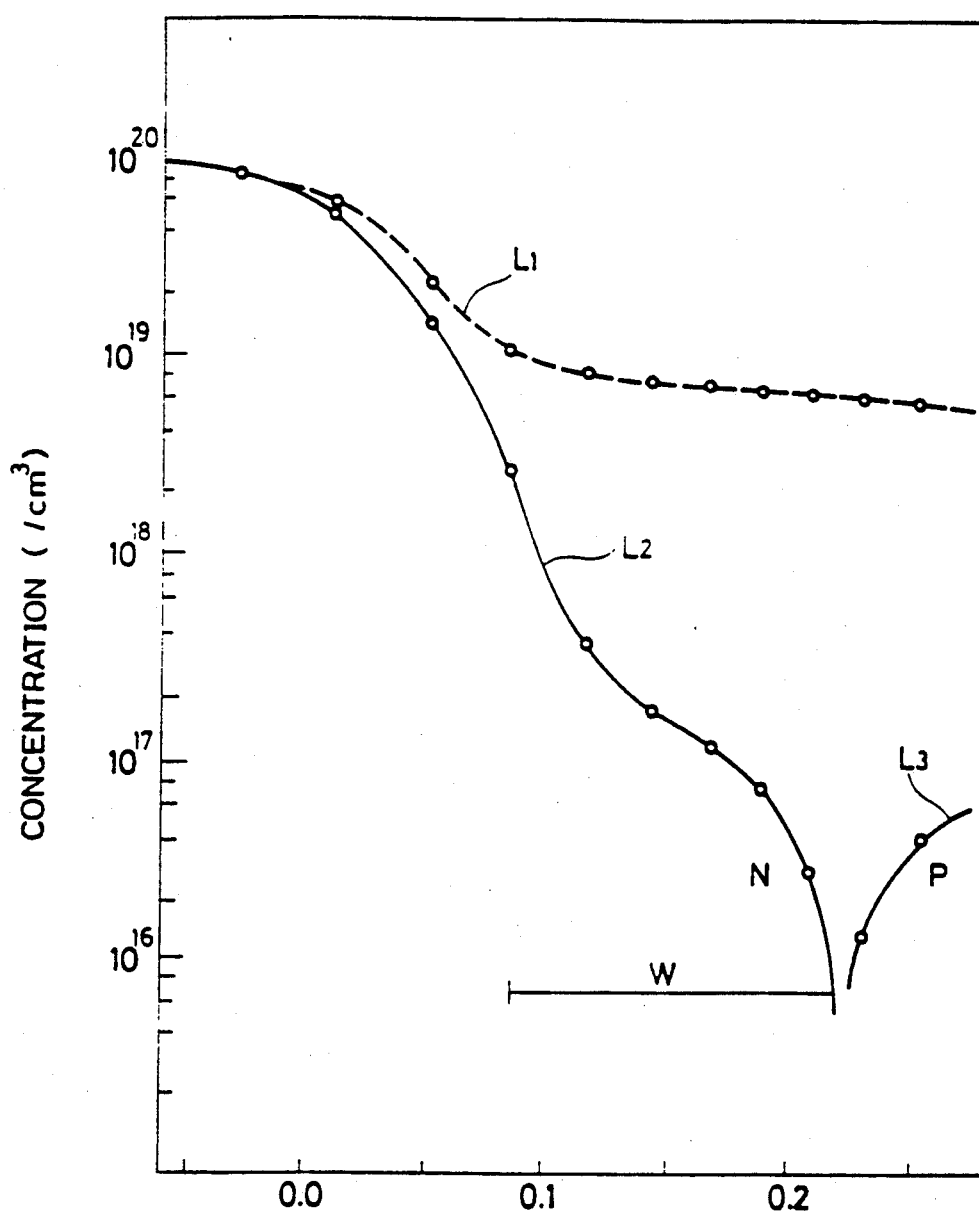
FIG. 3 is an impurity/carrier distribution diagram showing distribution of impurity or carriers near a source region.

FIG. 3 is a graph showing a carrier distribution and an impurity concentration in the surface channel direction of the source region in a pentode region of a MOS transistor according to the present invention. The curve L1 represents carrier distribution, the curve L2 represents n type impurity concentration and the curve L3 represents p type impurity concentration. The measurement conditions in FIG. 3 are as follows.

Film thickness $T_{GOX}$ of gate oxide film 3: 10 nm
Film thickness $T_{SOX}$ of gate
overlapped oxide film 10: 15 nm
Metallurgic gate length $L_{met}$: 0.5 μm
Sidewall length W: 0.2 μm
Dose D of ion implantation into
n− impurity region 5b: $5 \times 10^{12} cm^{-2}$
Drain voltage $V_D$: 5 V
Gate voltage $V_G$: 5 V The metallurgic gate length is almost equal to a length between the n+ source region 5a and the n+ drain region 6a.

When the transistor is in the off state, the impurity concentration of the n− impurity region 5b has a low value as shown by the curve L2 in FIG. 3. On the other hand, when the transistor is in the on state, the carrier concentration is increased to about $10^{19} cm^{-3}$ as shown by the curve L1. This means that a charge storage layer is 10 formed on a surface of the n− impurity region under influence of electric field from the sidewall portion 4b of the gate electrode. Accordingly, the parasitic resistance in this portion is decreased to improve the on-resistance characteristic of the transistor.

Figure 4A:
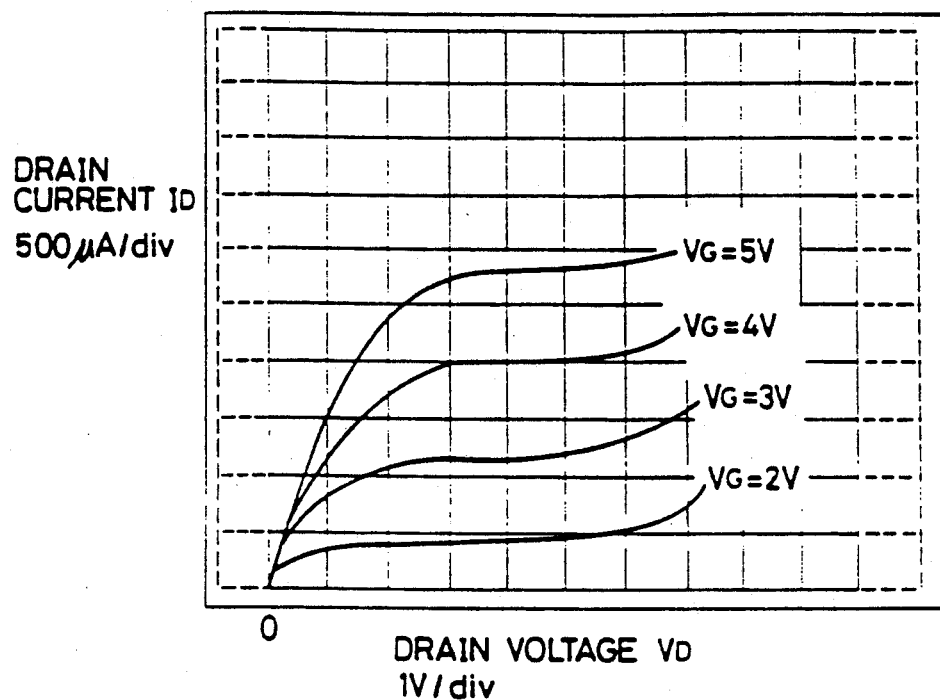
FIG. 4A is a drain characteristic diagram showing on-resistance characteristics of conventional LDD MOS transistors.
Figure 4B:
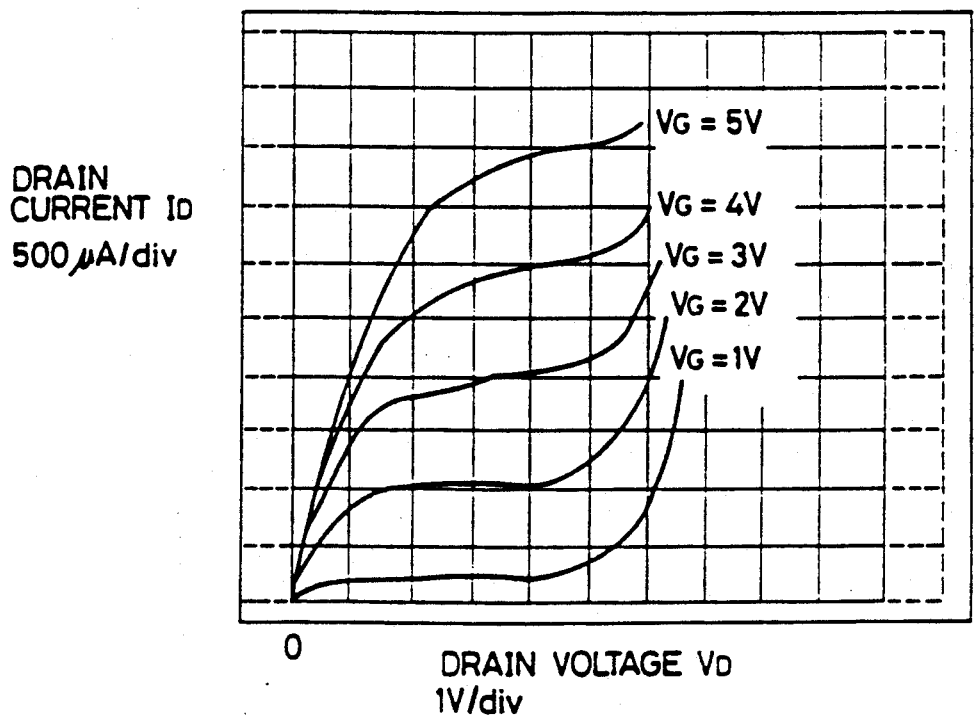
FIG. 4B is a drain characteristic diagram showing on-resistance characteristics of LDD MOS transistors according to the present invention.

FIGS. 4A and 4B are graphs showing drain characteristics of a conventional LDD MOS transistor and an LDD MOS transistor of the present invention, respectively. In each graph, the abscissa represents a drain voltage $V_D$ and the ordinate represents a drain current $I_D$, with a gate voltage $V_G$ being used as a parameter of each curve. By comparison of those graphs, it is clear that the LDD MOS transistor of the present invention shown in FIG. 4 has an excellent on-resistance characteristic in respect of the drain current $I_D$.

In addition, in the LDD MOS transistor of the present invention, the thickness of the gate overlapped oxide film 10 is larger than that of the gate oxide film 3 by a predetermined value. The thickness of the gate overlapped oxide film 10 is set taking account of the following two conditions. The first condition is that the thickness of this film ensures formation of a charge storage layer on surfaces of the n− impurity regions 5b and 6b by exerting the influence of the electric field from the sidewall portion 4b of the gate electrode onto those regions as described above. The second condition is that the thickness of this film is set to suppress increase of a gate capacitance formed between the gate electrodes 4, 4b and the silicon substrate 2. Those conditions are indicated below in a concrete manner. For example, it is assumed that an LDD MOS transistor of an embodiment of the present invention is formed with the following conditions:

Film thickness $T_{GOX}$ of gate oxide film 3 = 10 nm
Film thickness $T_{SOX}$ of gate overlapped oxide film 10 = 15 nm
Metallurgic gate length Lmet = 0.5 μm
Sidewall length W = 0.2 μm Comparing this case with a case of $T_{GOX} = T_{SOX} = 10$ nm in a conventional LDD MOS transistor, a ratio between the respective gate capacitances C and Co is as follows.

$$Co = L_{met}/T_{GOX} + 2W/T_{SOX}$$
$$C \quad (L_{met} + 2W)/T_{GOX}$$
$$= 0.85$$

Thus, the rapid responsiveness of the LDD MOS transistor can be improved by decreasing the gate capacitance. The thickness of the gate overlapped oxide film 10 is preferably 150Å to 300Å. The lower limit 150Å of the film thickness is not the same as that of the gate oxide film 3, and it is selected such that the charge storage layer is formed on the surfaces of the n− impurity regions 5b and 6b, while the upper limit 300Å is selected such that increase of the gate capacitance can be suppressed.

Next, a method of manufacturing an LDD MOS transistor according to the present invention will be described. FIGS. 5A to 5J are sectional views showing successive steps of the manufacturing method.

Figure 5A:
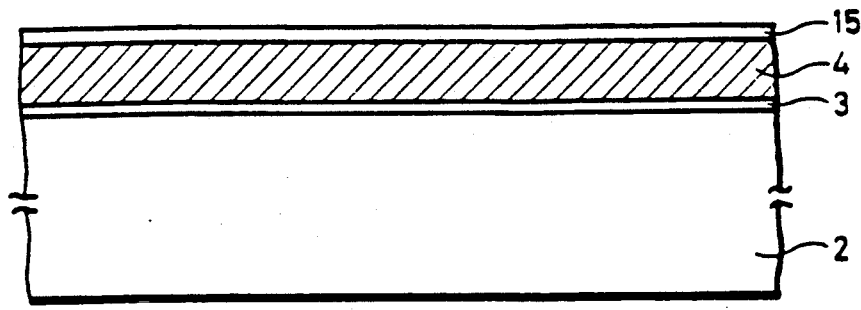
FIGS. 5A to 5J are sectional views showing successive steps of a method of manufacturing an LDD MOS transistor according to an embodiment of the present invention.

First as shown in FIG. 5A, an oxide film 3 is formed on a main surface of a p− silicon substrate 2 by a thermal oxidation process. Further, a polysilicon layer 4 is formed on a surface of the oxide film 3 by a CVD (chemical vapor deposition) method. Further, an oxide film 15 is formed on a surface of the polysilicon layer 4 by the CVD method.

Figure 5B:
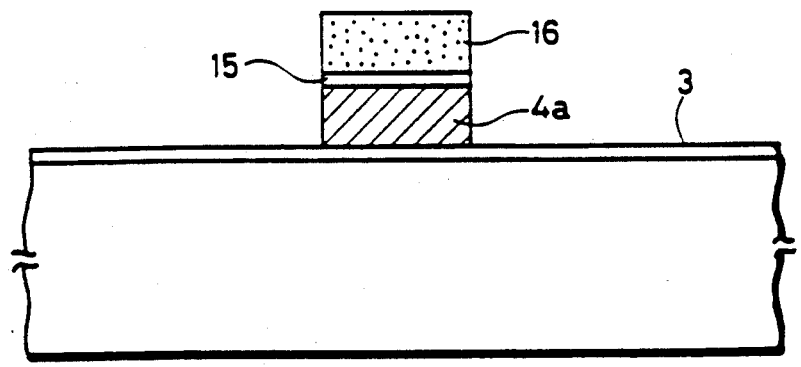

Then, as shown in FIG. 5B, resist 16 is coated and patterned, whereby the oxide film 15 and the polysilicon layer 4 are patterned in a predetermined form by an anisotropic etching process. The patterned polysilicon layer 4 constitutes a main portion 4a of a gate electrode.

Figure 5C:
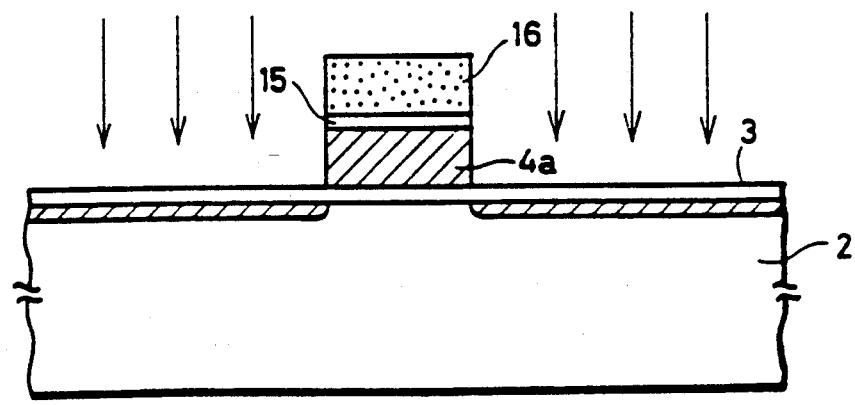

Subsequently, as shown in FIG. 5C, using the patterned resist 16 as a mask, n type impurity such as phosphorus or arsenic is implanted into the silicon substrate 2 on the order of a dose of $10^{13}/cm^2$ by ion implantation. This ion implantation may be done by using the oxide film 15 or the polysilicon layer 4a as a mask after removal of the resist 16.

Figure 5D:
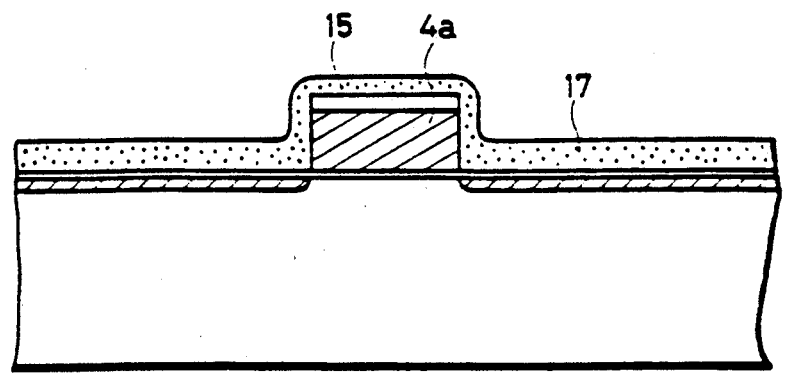

Further, as shown in FIG. 5D, the resist 16 is removed and a material having oxidation resistant property such as a nitride film 17 is deposited on surfaces of the oxide film 3, the polysilicon layer 4a and the oxide film 15 by the CVD method.

Figure 5E:
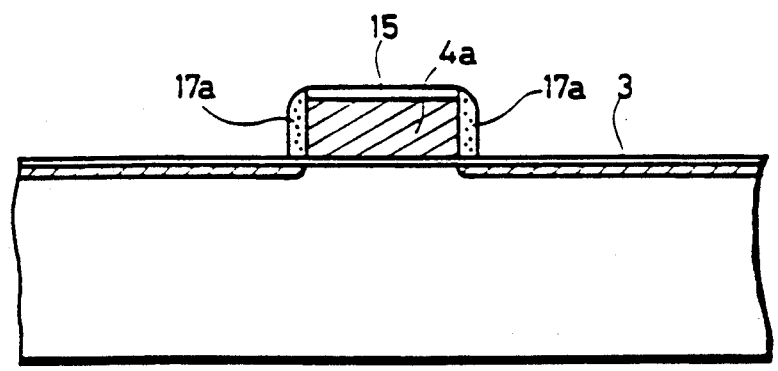

Then, as shown in FIG. 5E, the nitride film 17 is anisotropically etched, whereby the nitride film 17 is left only on side surfaces of the polysilicon layer 4a and the oxide film 15. By this step, sidewalls 17a of the nitride film are formed. The sidewalls 17a of the nitride film have a minimum thickness required for covering the side surfaces of the polysilicon layer 4a, for example, a thickness of less than 500Å.

Figure 5F:
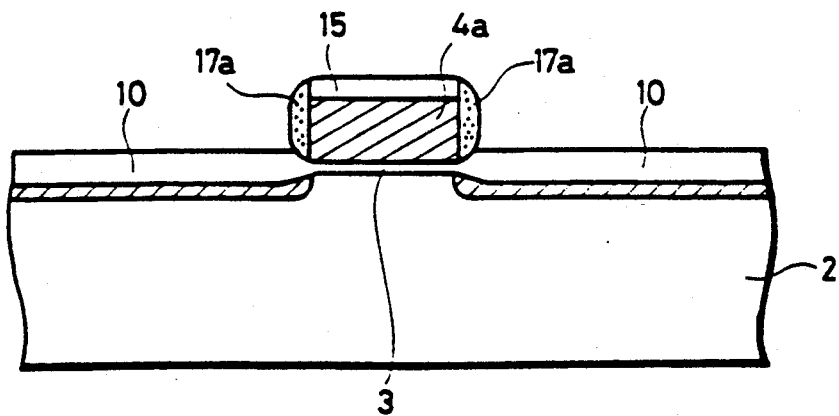

Further, as shown in FIG. 5F, the surface of the silicon substrate 2 is oxidized by using, as masks, the oxide film 15 and the polysilicon layer 4a for the gate electrode covered with the nitride film sidewall 17a, whereby a gate overlapped oxide film 10 thicker than the gate oxide film 3 is formed. This thermal oxidation process is applied by the same conditions as for the oxidation process of the gate oxide film 3.

Figure 5G:
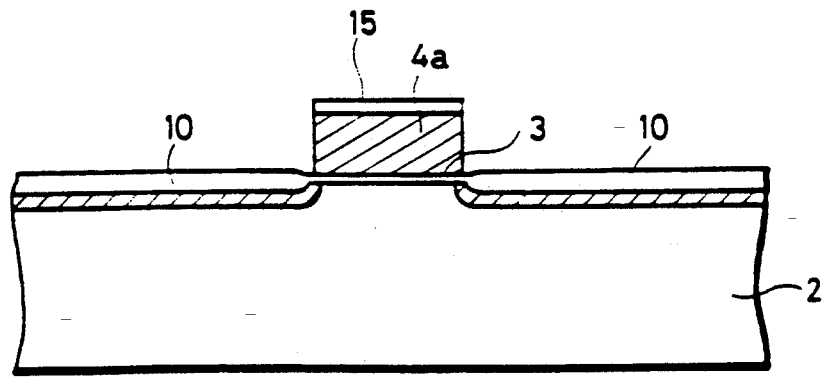

Then, as shown in FIG. 5G, the sidewalls 17a of the nitride film are etched and removed.

Figure 5H:
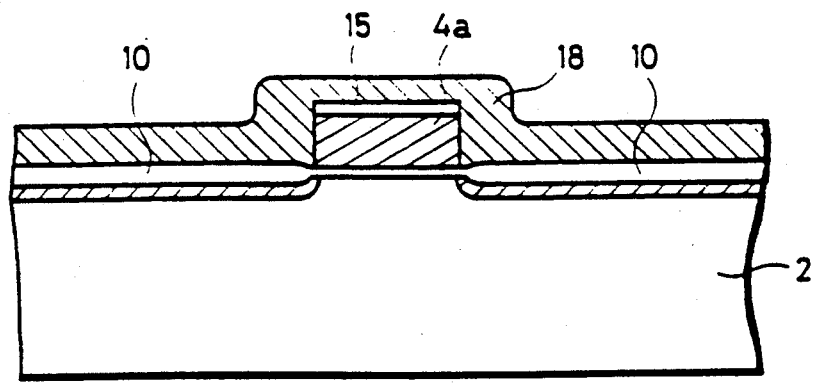

Further, as shown in FIG. 5H, a polysilicon layer 18 is deposited on the whole surface by using the CVD method.

Figure 5I:
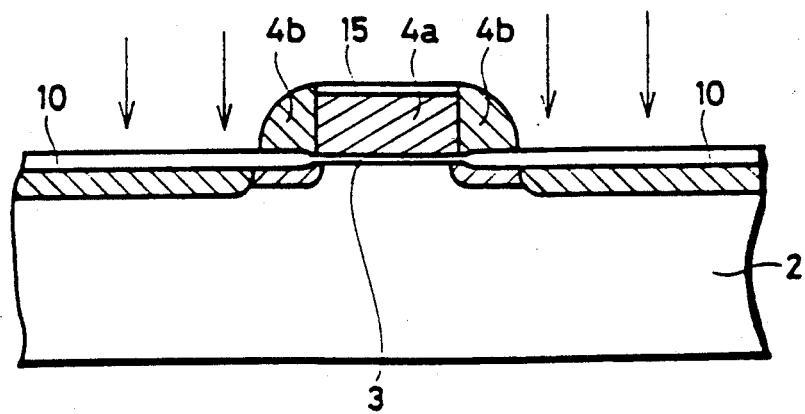

Subsequently, as shown in FIG. 5I, the polysilicon layer 18 is anisotropically etched, whereby the polysilicon layer 18 is left only on sidewalls of the polysilicon layer 4a for the gate electrode. Thus, sidewall portions 4b of the gate electrodes are formed. In this etching process, the oxide film 15 formed on the upper surface of the polysilicon layer 4a for the gate electrode serves as a layer for detection of an end of etching and for protection of the polycrystal silicon layer 4a. More specifically, the polycrystal silicon layer 18 is etched by, for example, anisotropic etching such as reactive ion etching. Then, when, as a result of the etching proceeding, the upper surfaces of the oxide films 10 and 15 start to be exposed, component of the discharged gas from the surfaces changes. By detecting a gas spectrum in such a change with, for example, a microscope, an end of etching is detected. Difference occurs in etching rate between the polycrystal silicon layer 18 and the oxide films 10 and 15. Thus, once the etching reaches the oxide film surface 15, the subsequent etching rate is decreased. Therefore, the polycrystal silicon layer 4a covered with the oxide film 15 can be prevented from being overlatched by finishing etching at this time point. Thus, the main portion for the gate electrode (polysilicon layer) 4a is prevented from being overetched and removed. Then, using the main portion 4a of the gate electrode and the sidewall portions 4b as masks, n type impurity of a high concentration is implanted into the surface of the silicon substrate 2.

Figure 5J:
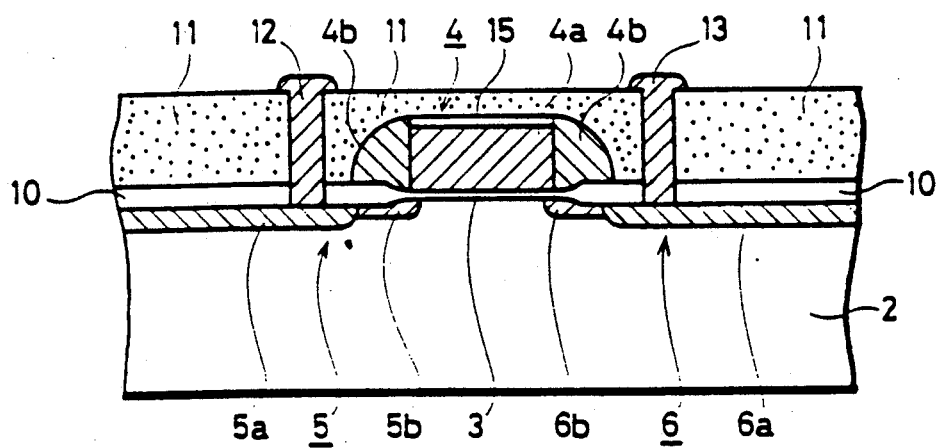

After that, as shown in FIG. 5J, the impurity is thermally diffused to form an n+ source region 5a, an n+ drain region 6a and n− impurity regions 5b and 6b. Then, an interlayer insulating film 11 is deposited over the whole surface. Further, contact holes are formed in the interlayer insulating film 11 and a source electrode connection 12 and a drain electrode connection 13 are formed to be in contact with the n+ source region 5a and the n+ drain region 6a, respectively.

Thus, the LDD MOS transistor is manufactured by the above described steps.

As described above, the gate overlapped oxide film 10 on the n− impurity regions 5b and 6b is formed by the thermal oxidation process. Generally, an oxide film formed by the thermal oxidation has a good quality compared with the oxide film damaged by a conventional ion implantation. Therefore, there is little defect in the oxide film and the hot carriers injected in the oxide film are trapped therein, which makes it possible to prevent change in the threshold voltage or lowering of the mutual conductance.

Although in the above described embodiment the oxide film 15 is deposited on the surface of the gate electrode 4 and is used for detection of an etching end, the oxide film 15 may not be formed particularly.

In addition, although the n channel LDD MOS transistor was described in the foregoing embodiment, the present invention is also applicable to a p channel LDD MOS transistor by inverting conductivity types of a substrate and impurity.

As described above, according to the present invention, the impurity regions formed in the semiconductor substrate are of the LDD structure and the impurity region of the lower concentration of the LDD structure is placed under the influence of the gate electrode. This structure makes it possible to prevent deterioration of the transistor characteristics, which otherwise would be caused by injection of the hot carriers caused by field effect concentration into the gate oxide film, and accordingly duration of reliability of the device is improved. Further, the charge storage layer formed in the impurity region of the lower concentration serves to reduce influence of parasitic resistance and to improve the on-resistance characteristic of the transistor. In addition, the relatively large thickness of the gate oxide film located between the gate electrode and the impurity region of the lower concentration serves to decrease the gate capacitance. The above described structure accomplishes rapid responsitivity of the transistor. In consequence, the MIS device of the present invention has excellent characteristics in the on-resistance, the duration of reliability and rapid responsitivity. Further, the manufacturing method according to the present invention makes it possible to obtain such an MIS device.

Figure 6:
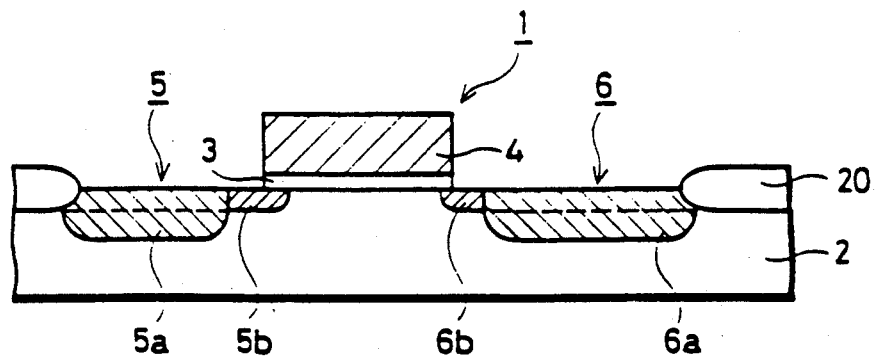
FIG. 6 is a sectional structure view showing an LDD MOS transistor according to the second embodiment of the present invention.

A second embodiment of the present invention will be described with reference to FIGS. 6 and 7A through 7C. Referring to FIG. 6, an MOS transistor 1 comprises a gate insulating film 3, a gate electrode 4 and source and drain regions 5 and 6, which are of a so-called LDD structure having a double structure in which n+ impurity regions 5a and 6a and n− impurity regions 5b and 6b are respectively formed in a p-type silicon substrate 2. The n− impurity regions 5b and 6b extend under the gate electrode 4. Boundaries between the n− impurity regions 5b and 6b and the n+ impurity regions 5a and 6a are located slightly away from end portions of the gate electrode 4. Thus, the end portions of the n+ impurity regions 5a and 6a are located slightly away from the gate electrode 4, thereby preventing tunneling of the gate insulating films 3 and suppressing generation of a drain leak current.

Figure 7A:
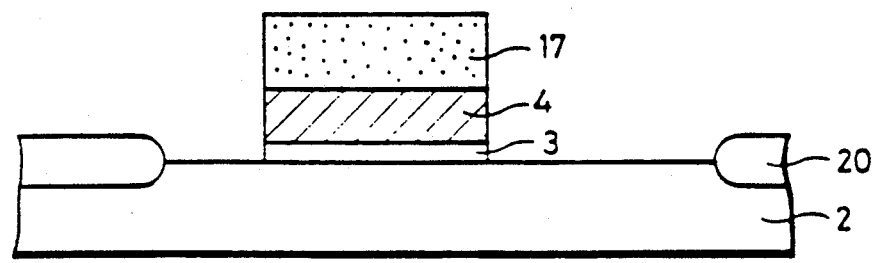
FIGS. 7A through 7C are sectional views showing steps of a method of manufacturing the LDD MOS structure shown in FIG. 6.

The MOS transistor 1 according to the second embodiment is manufactured by the following steps. Referring to FIG. 7A, field oxide films 20 are formed on predetermined positions of the surface of the p-type silicon substrate 2. Thereafter, a silicon oxide film and a polycrystal silicon layer are sequentially deposited on the surface of the p-type silicon substrate 2. Further, a nitride film 17 having oxidization resistant property is deposited on the polycrystal silicon layer by using LPCVD method. Then, the nitride film 17, the polycrystal silicon layer and the silicon oxide film are patterned in a predetermined form by photolithography and etching. By this step, the gate insulating film 3 and the gate electrode 4 are formed.

Figure 7B:
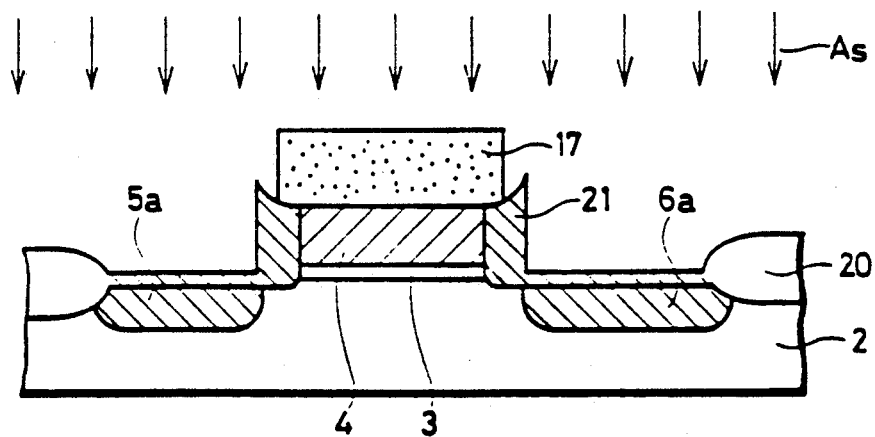

Referring to FIG. 7B, a thermal oxide films 21 are formed on sidewalls of the gate electrode 4 and the surface of the p-type silicon substrate 2 by a thermal process using the nitride film 17 as a mask. In this thermal process, since the nitride film 17 has oxidization resistance property, a thermal oxidize layer is not formed on the surface of the gate electrode 4 covered with the nitride film 17. On the other hand, impurity ion is injected into the gate electrode 4, which accelerates formation of an oxide film. Accordingly, thermal oxide films 21 formed on the sidewalls of the gate electrode 4 are relatively thicker than those formed on the surface of p-type silicon substrate. Subsequently, using the thermal oxide films 21 formed on the nitride film 17 and the sidewalls of the gate electrode 4 as masks, about $4 \times 10^{15}$ cm$^{-2}$ of impurity ion, for example, arsenic ion is implanted to form high-concentration n+ source and drain regions 5a and 6a.

Figure 7C:
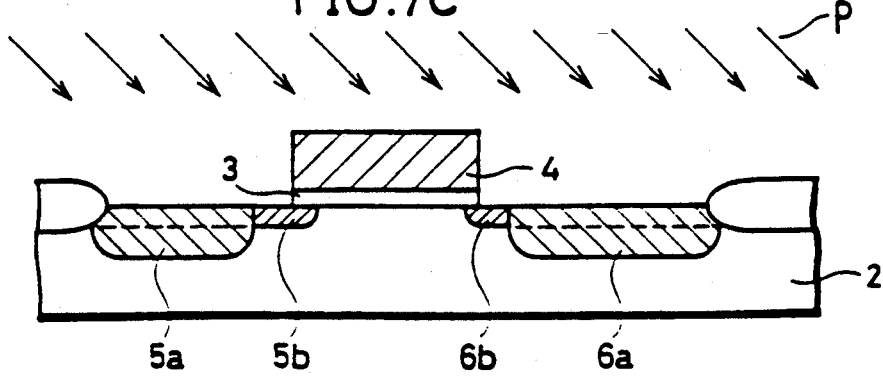
Figure 8:
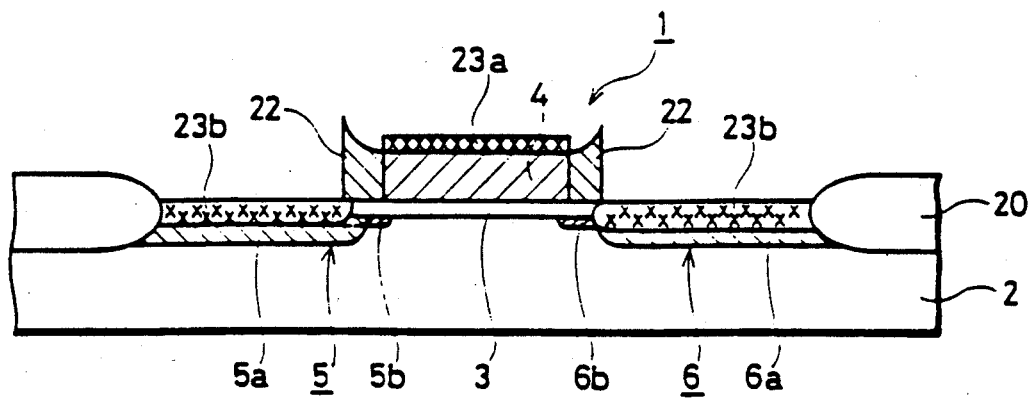
FIG. 8 is a sectional structural view of an LDD MOS transistor according to the third embodiment of the present invention.

Referring to FIG. 7C, the nitride film 7 and the thermal oxide films 21 are removed. Thereafter, the impurity ion such as phosphorus ion is implanted on the order of $1 \times 10^{13}$ cm$^{-2}$. The phosphorus ion is implanted at an angle of about 45° to a vertical direction of the major surface of the p-type silicon substrate 2 and with the p-type silicon substrate 2 being rotated. The phosphorus ion extends under the gate electrode 4 by the oblique rotation ion implantation. Accordingly, low-concentration n− source and drain regions 5b and 6b are formed, part of which extends to the underside of the gate electrode 4.

Figure 12A:
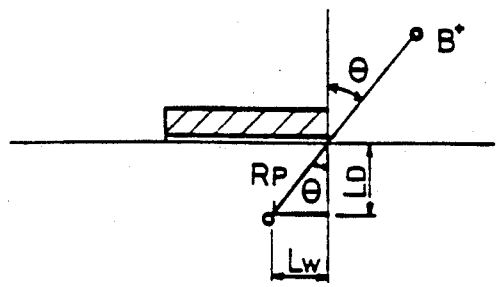
FIGS. 12A and 12B are diagrams showing relation between ion implantation angle and range in an oblique ion implantation employed in the manufacturing steps of the above first to the third embodiments.
Figure 12B:
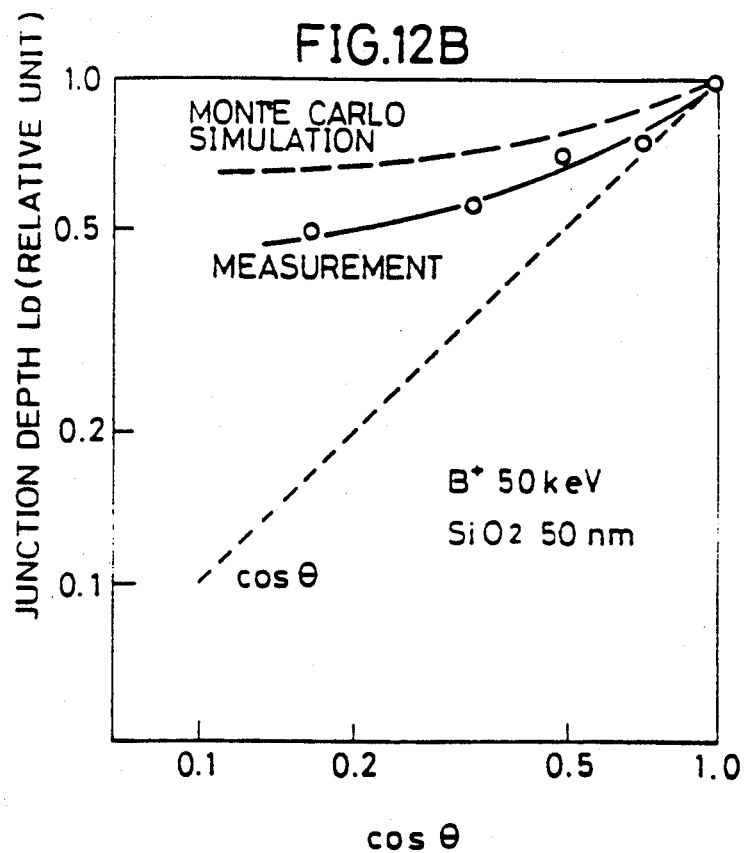

FIGS. 12A and 12B show a relation between an angle of implanting ion and an implantation distance into a substrate in an oblique rotation ion implantation method. A result shown in the drawings illustrates a case in which 500Å thickness of boron is implanted as an oxide film by implantation energy 55 keV. In FIG. 12A, implantation depth of the boron ion is represented as Rpcos $\theta$, and an overlapped amount under a gate electrode is represented as Rpcos $\theta$, while Rp indicates a projection range of the boron ion. FIG. 12B shows a relation between implantation depth $L_D$ and overlapped amount $L_W$ in an oblique ion implantation of boron by unit. It will be appreciated that the gate overlapped amount $L_w$ becomes sin $\theta$ times of the vertical implantation depth Ld, wherein a range of implantation angle in an oblique rotation ion implantation is approximately 20° to 45°, which corresponds to a range of 0.7 to 1.0 in the abscissa cos $\theta$ of FIG. 12B.

By the foregoing steps, the source and drain regions 5 and 6 having the LDD structure are formed.

Then, the surface of the p-type silicon substrate 2 is covered with an insulating film, followed by formation of contact holes, electrode connecting process and the like, resulting in the completed MOS transistor 1.

Now, a third embodiment of the present invention will be described with reference to FIG. 8 and FIGS. 9A through 9D. The third embodiment is a modified example of the second embodiment. Referring to FIG. 9, a MOS transistor 1 comprises sidewall spacers 22 of oxide film formed on sidewalls of the gate electrode 4. Silicide layers 23a and 23b of high melting point metal are formed on the upper surface of the gate electrode 4 and the surfaces of the source and drain regions 5 and 6. The silicide layers 23a and 23b are separated in a self-alignment manner by each of sidewall spacers 22 of oxide film, respectively. Such a silicide structure is referred to as a self-aligned silicide structure.

Referring to FIGS. 9A through 9D, manufacturing steps of the MOS transistor 1 will be described. First, referring to FIG. 9A, field oxide films 20 are formed in predetermined regions of the surface of the p-type silicon substrate 2. Thereafter, a gate insulating film 3 of nitride film is formed on the surface of the p-type silicon substrate 2. Then, a polycrystal silicon layer and a nitride film are deposited on the surface of the gate insulating film 3 to be patterned into a predetermined form, thereby forming a gate electrode 4 and a nitride film 17. Furthermore, using the nitride film 17 and the gate electrode 4 as masks, phosphorus ion is implanted into the surface of the p-type silicon substrate by the oblique rotation ion implantation method. The oblique rotation ion implantation method is the same as that described in the second embodiment. The low-concentration n− impurity regions 5b and 6b of are formed by the ion implantation.

Figure 9A:
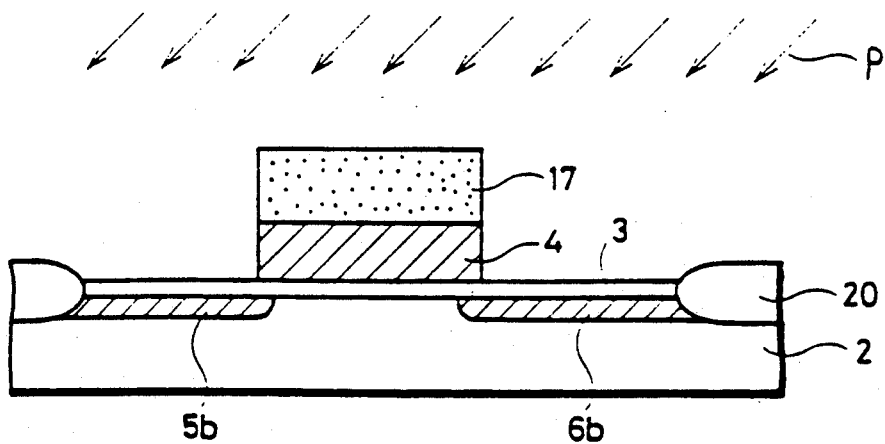
FIGS. 9 through 9D are sectional views showing steps of a method of manufacturing the LDD MOS transistor shown in FIG. 8.
Figure 9B:
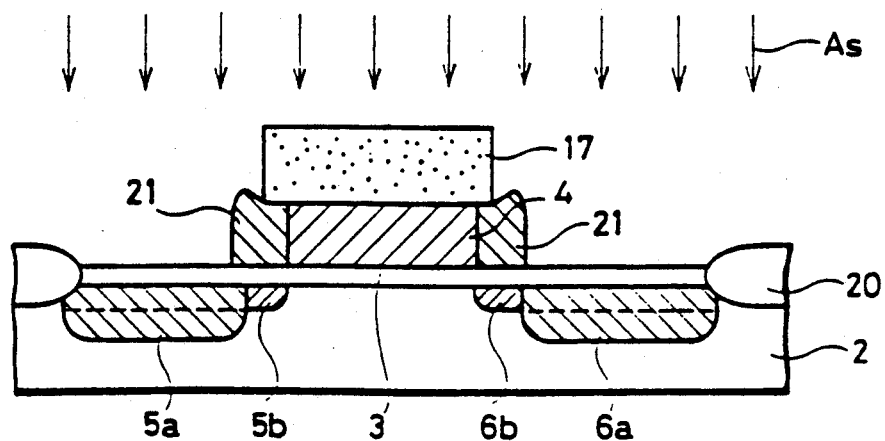

Referring to FIG. 9B, by a thermal process using the nitride film 17 as a mask, thermal oxide films 21 are formed only on the sidewalls of the gate electrode 4. The gate insulating film 3 is formed of a nitride film. Accordingly, in the thermal processing step, a thermal oxide film 21 is not formed on the surface of the p-type silicon substrate 2 due to oxidization resistance property of the nitride film. In addition, a thermal oxide film is not formed on the upper surface of the gate electrode 4 either for the same reason. Thereafter, arsenic ion is implanted into the surface of the p-type silicon substrate 2 using the nitride film 17 and the thermal oxide films 21 as masks. In this step, high-concentration n+ impurity regions 5a and 6a are formed. Up to this step, ion implantation for a formation of the lower-concentration impurity regions and ion implantation for a formation of the higher-concentration impurity regions are exchanged to each other, as compared with the manufacturing step shown in the second embodiment. Thus, in the LDD structure the sidewalls of the gate electrode 4 are covered with the thermal oxide films 21. Therefore, there is no need for removing the thermal oxide films 21 on the sidewalls. Accordingly, in removing the thermal oxide films 21, the field oxide films 20 are not simultaneously etched to have smaller thickness.

Figure 9C:
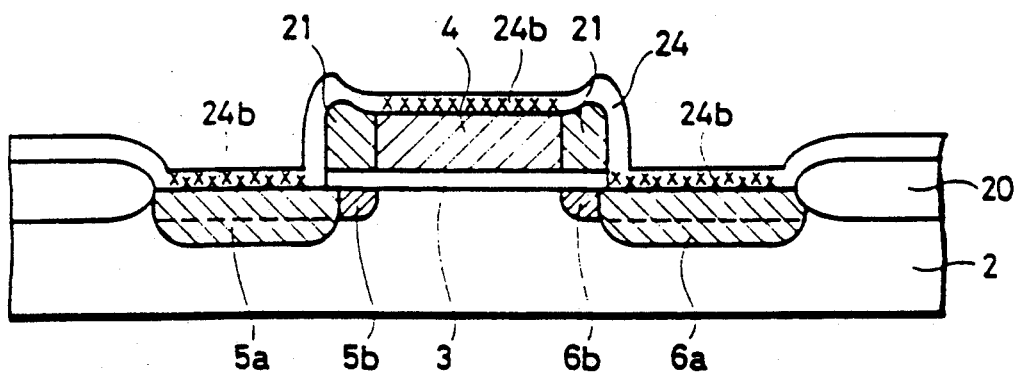

In addition, referring to FIG. 9C, exposed portions of the nitride film 17 and the gate oxide film 3 are removed. Then, using spattering, a titanium layer 24 is deposited over the whole surface. Then, by a thermal process, only a region 24b of the titanium layer 24, which is in contact with the surface of the gate electrode 4 and the surface of the p-type silicon 2, is silicidized. On the other hand, a region of the titanium layer 24 in contact with the thermal oxide films 21 is not silicidized.

Figure 9D:
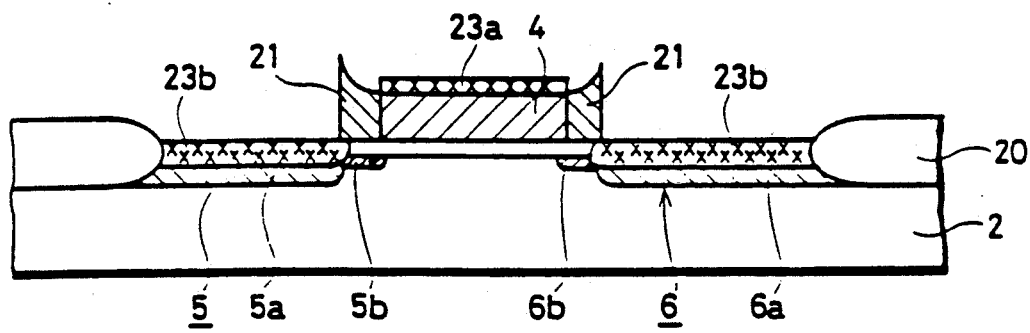

Referring to FIG. 9D, by removing a region of the titanium layer 24 which is not yet reacted, titanium silicide layers 23a and 23b are left only on the surfaces of the gate electrode 4 and the source and drain regions 5 and 6. By the above steps, an LDD MOS transistor having a self-aligned silicide structure is formed. The ion implantation step for forming the high-concentration n+ source and drain regions 5a and 6a can be performed after forming the self-aligned silicide structures 23a and 23b.

Figure 10:
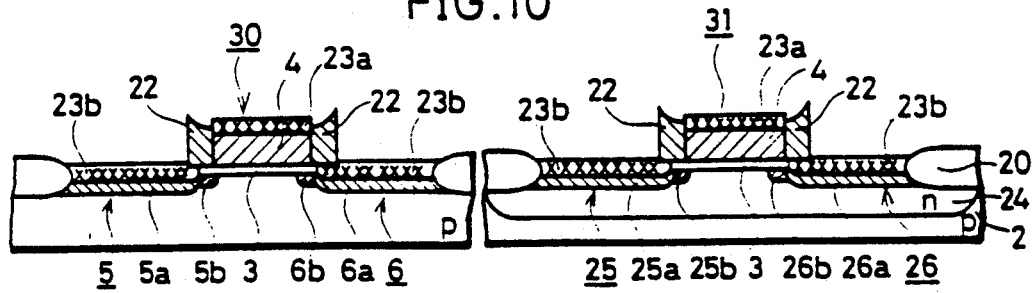
FIG. 10 is a sectional structural view of a CMOS inverter circuit according to the fourth embodiment of the present invention.

Now, a fourth embodiment of the present invention will be described, which relates to a CMOS transistor having an MOS transistor of the above second or the third embodiment. Referring to FIG. 10, the CMOS transistor comprises a n channel MOS transistor (hereinafter referred to as n MOS transistor) 30 and a p channel MOS transistor (hereinafter referred to as p MOS transistor) 31 formed in predetermined regions separated by field oxide films 20 on the surface of the p-type silicon substrate 2, respectively. The p MOS transistor 31 is formed in a n well region 24 formed in the p-type silicon substrate 2. The n MOS transistor 30 and the p MOS transistor 31 have an LDD MOS transistor structure having a self-aligned silicide structure described in the above second embodiment.

Figure 11A:
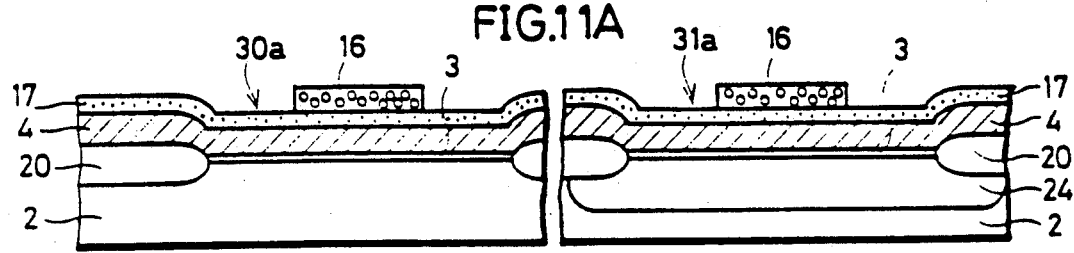
FIGS. 11A through 11G are sectional views showing steps of a method of manufacturing the CMOS inverter circuit shown in FIG. 1.

The manufacturing steps will be described in the following. Referring to FIG. 11A, field oxide films 20 are formed in the surface region of the p-type silicon substrate for separating a region 30a in which n channel MOS transistor (referred to as n MOS region) is to be formed and a region 31a in which a p channel MOS transistor (referred to as p MOS region)is to be formed. An n well region 24 is formed in the p MOS region 31a. Then, a gate insulating film 3, a polycrystal silicon layer 4 and a nitride film 17 are sequentially formed on the surfaces of the n MOS region 30a and p MOS region 31a. Furthermore, resist patterns 16 and 16 of a predetermined form are formed on the surface of the nitride film 17.

Figure 11B:
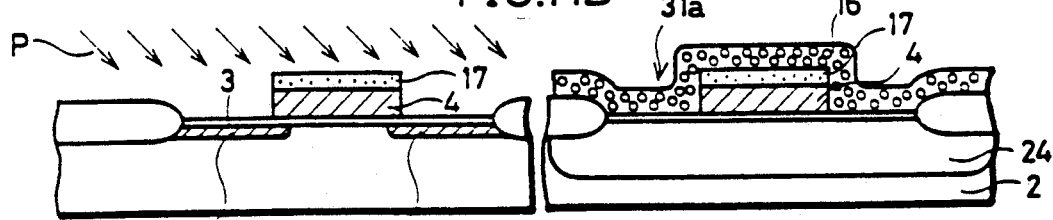

Referring to FIG. 11B, using the resist pattern 16 as a mask, the nitride film 17 and the polycrystal silicon layer 4 are patterned in a predetermined form to form gate electrodes 4 and 4 of the n MOS transistor 30 and the p MOS transistor 31. After further removal of the resist 16, the whole surface of the p MOS region 31a is again covered with the resist 16. Then, a step of manufacturing source and drain regions 5 and 6 of the n MOS transistor 30 is taken. By an oblique rotation ion implantation using the gate electrode 4 as a mask, phosphorus ion is implanted into the surface of p-type silicon substrate 2 to form n− impurity regions 5b and 6b.

Figure 11C:
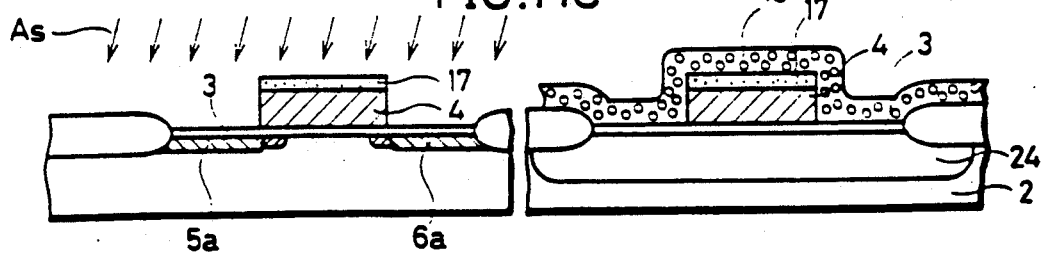

Referring to FIG. 11C, by a vertical ion implantation using the gate electrode 4 as a mask, arsenic ion is implanted into the surface of the p-type silicon substrate 2 to form n+ impurity regions 5a and 6a. The arsenic ion is implanted at an angle about 7° to the vertical direction of the surface of the p-type silicon substrate, so that so-called channeling phenomenon can be prevented, whereby part of the high-concentration n+ impurity regions 5a and 6a extend slightly under the gate electrode 4.

Figure 11D:
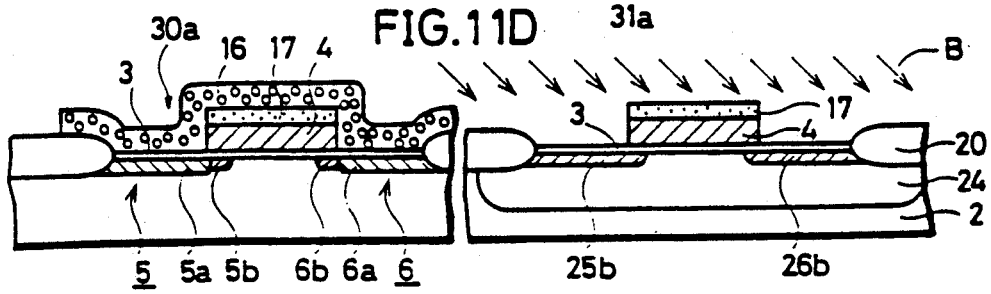

Referring to FIG. 11D, the resist 16 of the p MOS region 31a is removed. Thereafter, the surface of the n MOS region 31 is covered with the resist 16 to expose the p MOS region 31a. Then, by an oblique rotation ion implantation using the gate electrode 4 as a mask, n-type impurity such as boron is implanted into the n well region 24 of the p-type silicon substrate 2 to form n− impurity regions 25b and 26b.

Figure 11E:
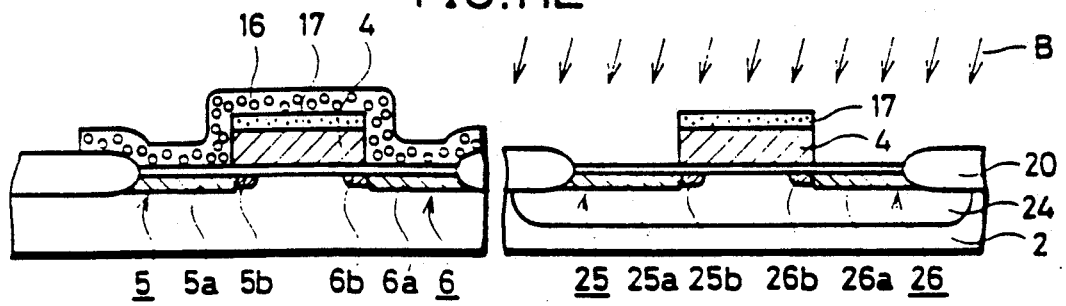

Referring to FIG. 11E, p-type impurity ion is further implanted at an angle of about 7° to the substrate to form high-concentration p+ impurity regions 25a and 26a.

Figure 11F:
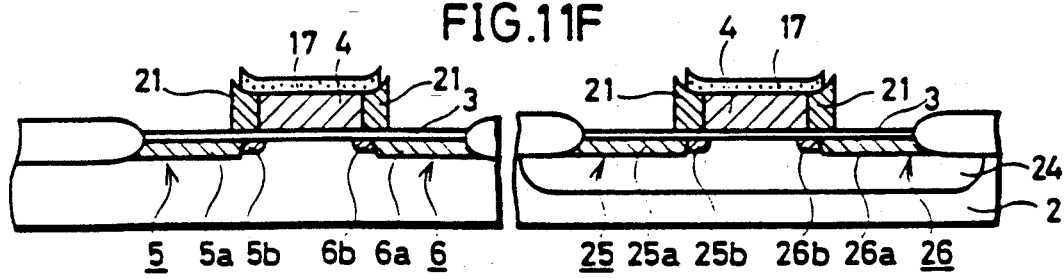

Referring to FIG. 11F, the resist 16 of the n MOS region 30a is removed. Then, by a thermal process, thermal oxide films 21 and 21 are left only on sidewalls of the gate electrodes 4 and 4 of the n MOS transistor 30 and the p MOS transistor 31. The thermal oxide films 21 are formed by the reaction proceeding from the sidewall surfaces of the gate electrode 4 to the inner portions. Accordingly, end surfaces of the polycrystal silicon layer of the gate electrode extend more inwardly compared with those before the formation of the thermal oxide film 21. As a result, locations of the end surfaces of the gate electrodes 4, and the high-concentration n+ impurity regions 5a and 6a and the high-concentration p+ impurity regions 25a and 26a are offset.

Figure 11G:
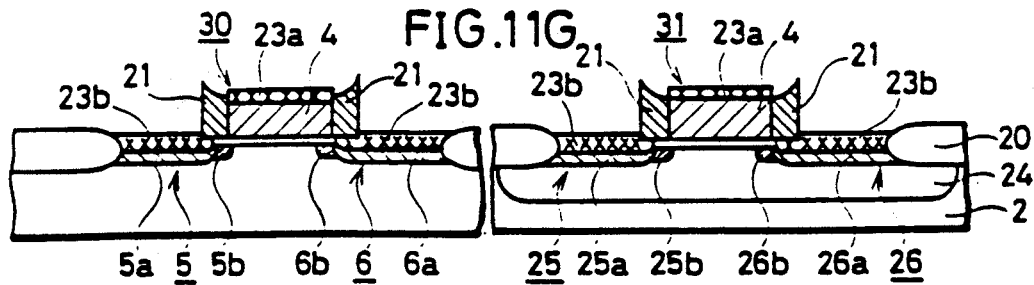

Referring to FIG. 11G, after the formation of a titanium layer on the whole surface of the p-type silicon substrate 2, titanium silicide layers 23a, 23b and 23b are formed on the upper surfaces of the gate electrodes 4 and 4 and the n+ impurity regions 5a and 6a, and the p+ impurity regions 25a and 26a. Then, unreacted regions of the titanium layers in contact with the thermal oxide films 21s are removed, thereby constructing a self-aligned silicide structure.

In this embodiment, for example, in the n MOS transistor 30, the n− impurity regions 5b and 6b and the n+ impurity regions 5a and 6a are formed by twice of ion implantation processes using the gate electrode 4 as a mask. Accordingly, when the source and drain regions of one MOS transistor of the CMOS transistors are formed, the source and drain regions of the other are covered with the resist (FIGS. 11B through 11C and FIGS. 11D through 11E). Accordingly, about two steps are enough for resist patterning after the step of FIG. 11B. Accordingly, simple manufacturing steps are implemented without necessity of complicated resist patterning.

In addition, the above embodiments include the following characteristics.

First, high-concentration impurity ion is implanted at a angle of about 7° to the surface of the silicon substrate. If the ion is implanted vertically to the surface of the substrate, in crystal lattice of such as a (100) silicon substrate and a (111) silicon substrate, there occurs a place where no implanted ion collides, so that such implanted ion are implanted deeply into the substrate. This channeling phenomenon can be prevented by the implantation at a slightly oblique angle.

In addition, by implanting ion through the gate insulating film 3, this effect is further enhanced.

Although in the above embodiments, the p MOS transistors 31 also has an LDD structure, it may be comprised of source and drain regions of a conventional single layer.

Figure 13:
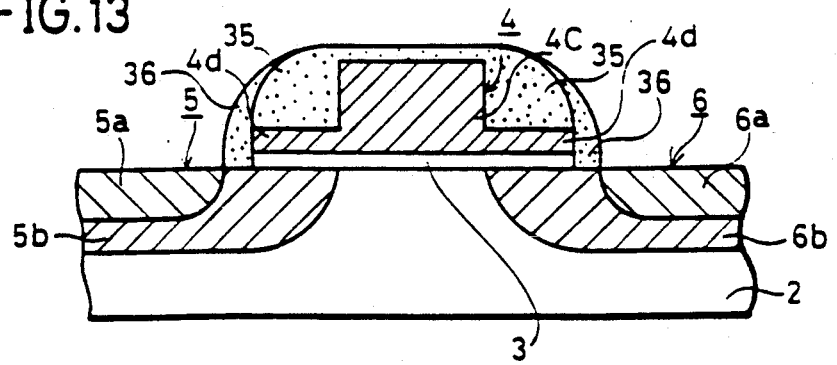
FIG. 13 is a sectional structural view of an LDD MOS transistor having a gate electrode of inverse-T configuration according to the fifth embodiment of the present invention.

A fifth embodiment of the present invention will be described i the following with reference to FIG. 13 and FIG. 14A through 14G. Referring to FIG. 13, an MOS transistor comprises a gate electrode 4 having an inverse-T cross sectional configuration. More specifically, the gate electrode 4 comprises a first portion 4d of a relatively large width and a second portion 4c of a relatively small width. First sidewall spacers 35 of insulating film are formed on sidewalls of the second portion 4c of the gate electrode 4, while second sidewall spacers 36 of insulating film are formed on sidewalls of the first portion 4d of the gate electrode 4. Each of source and drain regions 5 and 6 has an LDD structure comprising high-concentration impurity regions 5a and 6a formed on the surface of a silicon substrate 2 in self-alignment relation with the second sidewall spacers 36 and 36, and low-concentration impurity regions 5b and 6b formed in self-alignement relation with the second portion 4c of the gate electrode 4. Boundaries between the low-concentration impurity regions 5b and 6b and the high-concentration impurity regions 5a and 6a are offset through the second sidewall spacers 36 and 36 from end portions of the gate electrode 4.

Figure 14A:
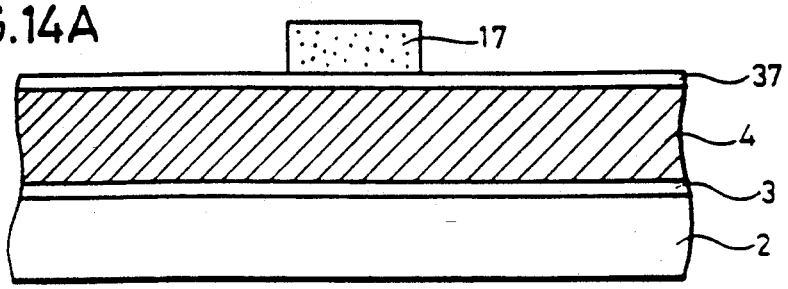
FIGS. 14A through 14G are sectional views showing steps of a method of manufacturing the LDD MOS transistor shown in FIG. 13.

FIGS. 14A through 14G show a step of manufacturing the MOS transistor shown in FIG. 13. Referring to FIG. 14A, a gate insulating film 3, a polysilicon layer 4 and a silicon oxide film 37 are sequentially formed on a silicon substrate 2. Then, after a resist 17 is coated, it is patterned into a predetermined form.

Figure 14B:
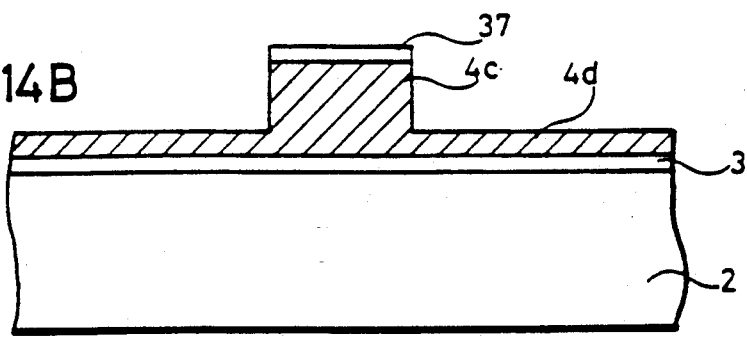

Referring to FIG. 14B, using the resist 17 as a mask, the silicon oxide film 37 is etched and further, the polysilicon layer 4 is etched to the midway of its thickness.

Figure 14C:
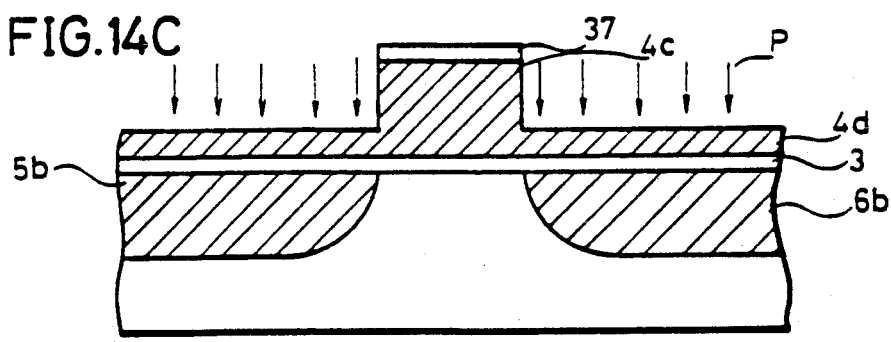

Referring to FIG. 14C, using the patterned silicon oxide film 37 and a polysilicon layer 4c thereunder as masks, a small dose of phosphor is implanted into the surface of the silicon substrate through a polysilicon layer 4d to form n$^-$ impurity regions 5b and 6b.

Figure 14D:
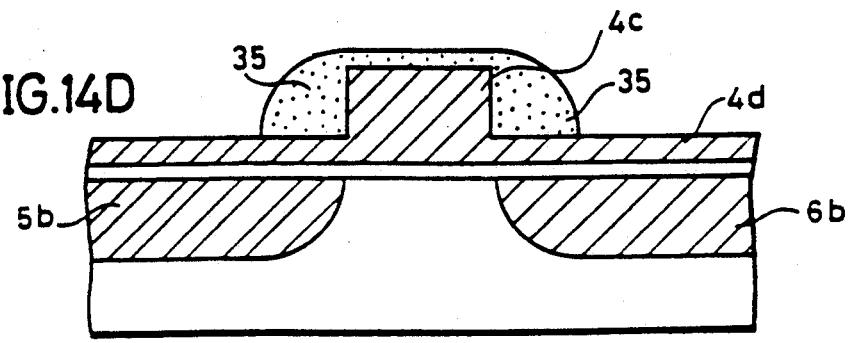

Referring to FIG. 14D, a silicon oxide film is deposited on the surfaces of the polysilicon layers 4c and 4d. Then, the silicon oxide film is anisotropically etched, thereby forming sidewall spacers 35 and 35 of silicon oxide film on sidewalls of the polysilicon layer 4c.

Figure 14E:
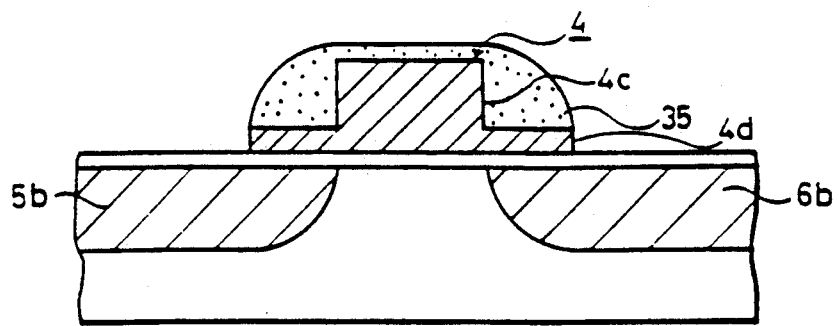

Referring to FIG. 14E, using the sidewall spacers 35 as a mask, the polysilicon layer 4d is etched into a predetermined form, thereby forming a gate electrode 4 of an inverse-T configuration.

Figure 14F:
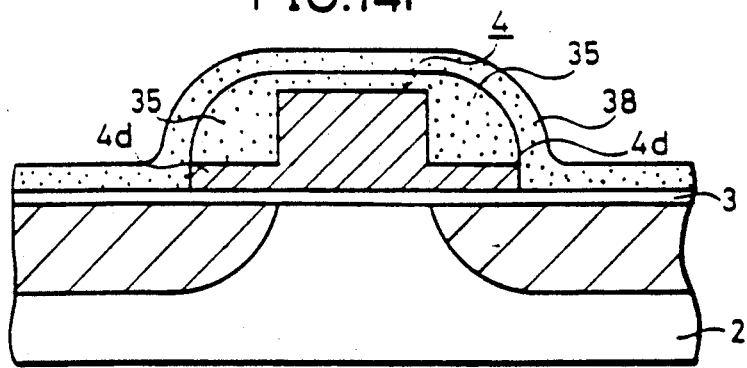

Referring to FIG. 14F, a silicon oxide film 38 is again deposited over the whole surface of the silicon substrate 2 on which the gate electrode 4 has been formed.

Figure 14G:
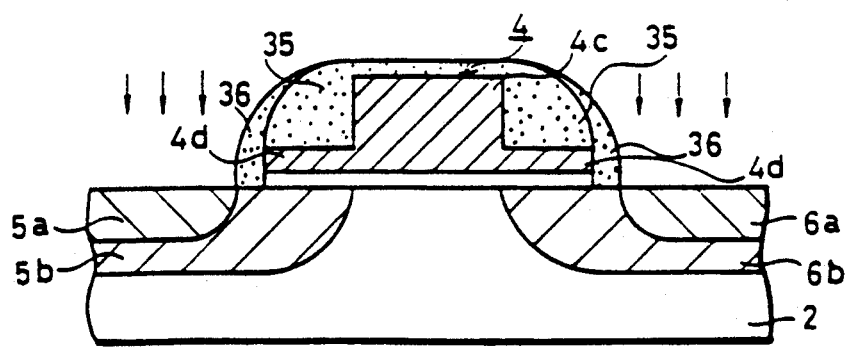

Referring to FIG. 14G, the silicon oxide film 38 is anisotropically etched to form the first sidewall spacers 35 and second sidewall spacers 36 on sidewalls of the first portions 4d Of the gate electrode 4. Then, using the second sidewall spacer 36 as a mask, arsenic (As) is implanted into the surface of the silicon substrate to form high-concentration n$^{30}$ impurity regions 5a and 6a. Thereafter, impurity ion is activated by a thermal process. The foregoing steps accomplishes an MOS transistor having the LDD structure.

Figure 15:
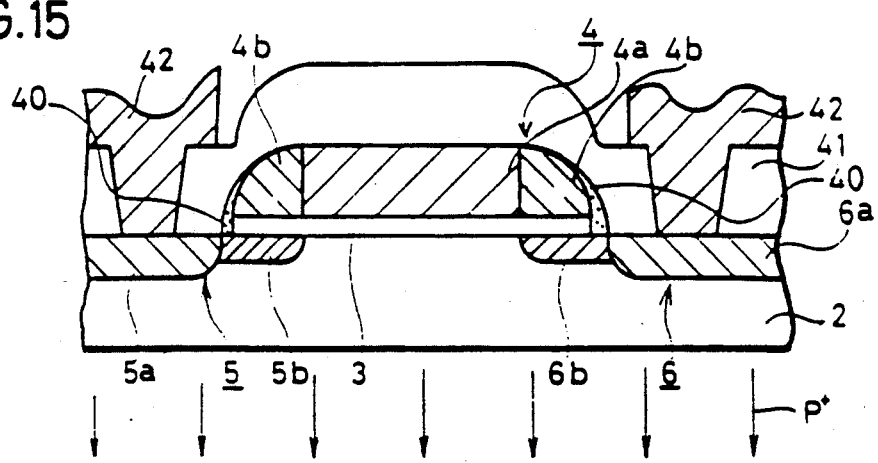
FIG. 15 is a sectional structural view of an LDD MOS transistor according to the sixth embodiment of the present invention.

Now, a sixth embodiment of the present invention will be described with reference to FIGS. 15 and 16A to 16D. Referring to FIG. 15, an MOS transistor comprises a gate electrode 4 comprising a main portion 4a having a rectangular section and conductive sidewall spacers 4b and 4b formed on sidewalls of the main portion 4a.

Sidewall spacers 40 and 40 of insulating film are further formed on sidewalls of the conductive sidewall spacers 4b and 4b of the gate electrode 4. Each of source and drain regions 5 and 6 has an LDD structure comprising high-concentration n$^+$ impurity regions 6a and 5a formed on the surface of a p-type silicon substrate 2 in a self-alignement relation with insulating film sidewall spacers 40 and 40, and low-concentration n-impurity regions 5b and 6b formed in a self-alignement relation with the main portion 4a of the gate electrode 4. The conductive sidewall spacers 4b and 4b are connected with the main portion 4a of the gate electrode 4. The n$^-$ impurity regions 5b and 6b have their upper portions covered with the conductive sidewall spacers 4b, thereby constituting a so-called gate overlapped structure. Boundaries between the n$^-$ impurity regions 5b and 6b and the n$^+$ impurity regions 5a and 6a are offset through the insulating film sidewall spacers 40 from end portions of the conductive sidewall spacers 4b and 4b.

Figure 16A:
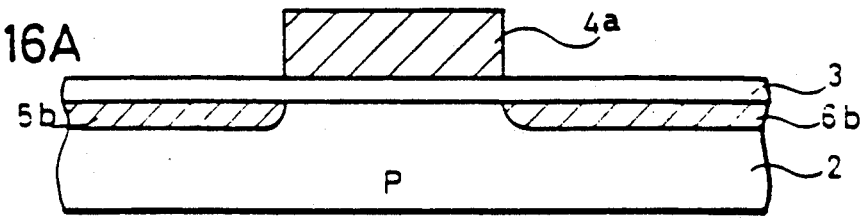
FIGS. 16A through 16D are sectional views showing steps of a method of manufacturing the LDD MOS transistor shown in FIG. 10.

Steps of manufacturing the MOS transistor shown in FIG. 15 will be described with reference to FIGS. 16A through 16D. Referring to FIG. 16A, a gate insulating film 3 and a polycrystal silicon layer are deposited on a surface of a p-type silicon substrate 2. Then, the polycrystal silicon layer 4a is patterned into a predetermined form. Using the patterned polycrystal silicon layer 4a as a mask, a small dose of phosphor (P) ion is implanted into the surface of the p-type silicon substrate 2. n$^-$ impurity regions 5b and 6b are formed by this step.

Figure 16B:
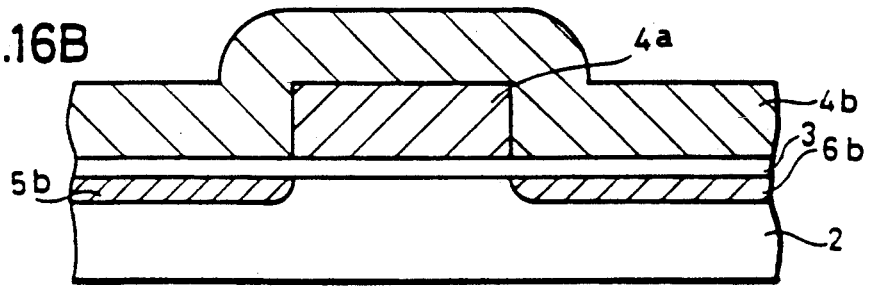

Referring to FIG. 16B, a conductive polycrystal silicon layer 4b is deposited on surfaces of the gate insulating film 3 and the polycrystal silicon layer 4a.

Figure 16C:
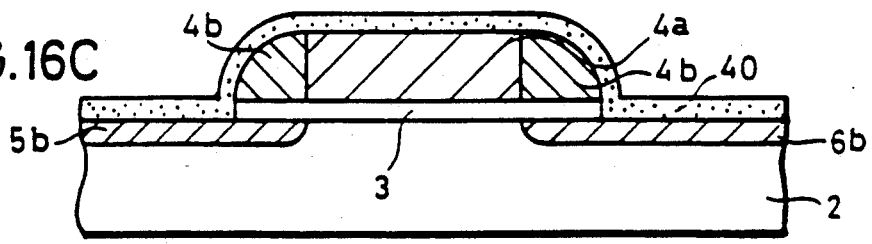

Referring to FIG. 16C, the polycrystal silicon layer 4b is anisotropically etched to form conductive sidewall spacers 4b and 4b on sidewalls of the polycrystal silicon layer 4a. Then, the gate insulating film 3 is etched using the conductive sidewall spacers 4b and 4b as a mask, thereby forming a main portion 4a and conductive sidewall spacers 4b and 4b of the gate electrode 4. Furthermore, an insulating film 40 is deposited over the whole surface of the p-type silicon substrate 2.

Figure 16D:
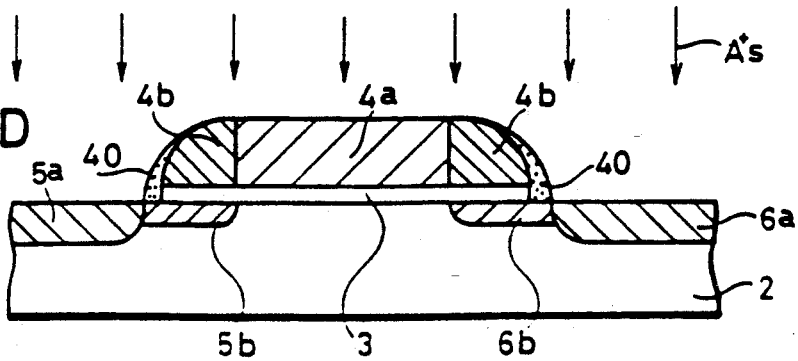

Referring to FIG. 16D, the insulating layer 40 is anisotropically etched to leave the insulating film sidewall spacers 40 and 40 only on the sidewalls of the conductive sidewall spacers 4b and 4b and the gate insulating film 3. Next, using the insulating film sidewall spacers 40 and 40 as a mask, large dose of arsenic ion is implanted into the p-type silicon substrate 2, thereby forming n$^+$ impurity regions 5a and 6a.

Thereafter, after formation of an interlayer insulating film 41 and contact holes in predetermined regions, are connection layers 42 are formed. Manufacturing of an MOS transistor is accomplished by the foregoing steps.

Figure 17:
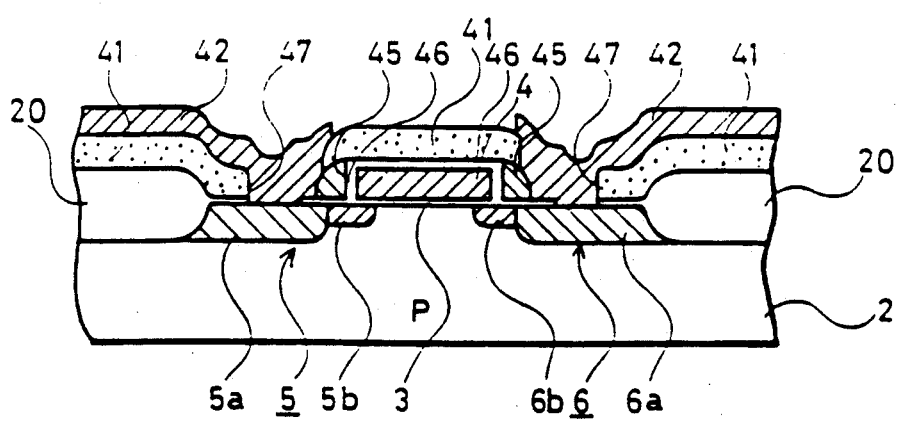
FIG. 17 is a sectional structural view of an LDD MOS transistor according to the seventh embodiment of the present invention.

Now, a seventh embodiment of the present invention will be described with reference to FIGS. 17 and 18A through 18D. Referring to FIG. 17, an MOS transistor comprises conductive sidewall spacers 45 and 45 on sidewalls of a gate electrode 4 through an insulating film 46. The conductive sidewall spacers 45 and 45 are insulated from source and drain regions 5 and 6 through a gate oxide film 3. Each of the source and drain regions 5 and 6 has an LDD structure comprising high-concentration n$^+$ impurity regions 5a and 6a and low-concentration n$^-$ impurity regions 5b and 6b. Parts of the n$^-$ impurity regions 5b and 6b are overlapped under the gate electrode 4. Boundaries between the n$^-$ impurity regions 5b and 6b, and the n$^+$ impurity regions 5a and 6a are located under the conductive sidewall spacers 45 and 45. The conductive sidewall spacers 45 and 45 have portions exposed to inner portions of contact holes 47 formed in an interlayer insulating film 41. The exposed surface is connected with connection layers 42. Thus, by applying a predetermined potential from the connection layers 42 and 42 to the conductive sidewall spacers 45 and 45 formed on the sidewalls of the gate electrode 4, hot carriers generated near the low-concentration n$^-$ impurity regions 5b and 6b in the source and drain regions 5 and 6 can be taken out through the gate insulating film 3.

Figure 18A:
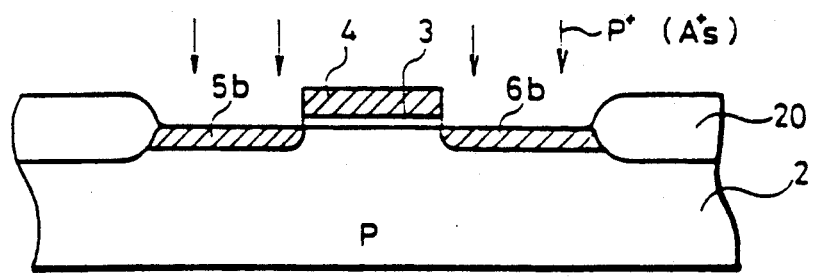
FIGS. 18A through 18E are sectional views showing steps of a method of manufacturing the LDD MOS transistor shown in FIG. 17.

Steps of manufacturing the MOS transistor shown in FIG. 17 will be described with reference to FIGS. 18A through 18D. Referring to FIG. 18A, field oxide films 20 are selectively formed on major surfaces of a p-type silicon substrate 2. An oxide film and a polycrystal silicon layer are deposited on a region surrounded by the field oxide films 20 so as to be patterned into a predetermined form, thereby forming a gate electrode 4 and a gate insulating film 3. In addition, using the gate electrode 4 as a mask, relatively low concentration ($10^{16}-10^{18}$ cm$^{-3}$) arsenic or phosphor is implanted to form n$^-$ impurity regions 5b and 6b.

Figure 18B:
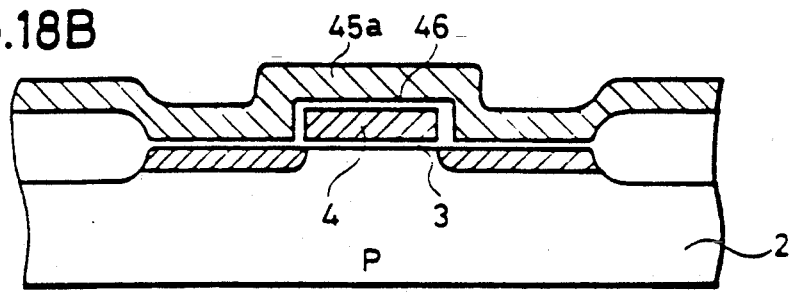

Referring to FIG. 18B, an insulating film 46 having thickness of 400Å is formed on the surfaces of the p-type silicon substrate 2 and the gate electrode 4. In addition, a polycrystal silicon layer 45a having thickness of 5000Å is formed on a surface of the insulating film 46. The thickness of the polycrystal silicon layer 45a is an important factor for determining a relative offset amount between n$^-$ impurity regions 5b and 6b and n$^+$ impurity regions 5a and 6a of an LDD structure in a later step. The polycrystal silicon layer 45a have a good step coverage with respect to a configuration of a gate electrode 4. Accordingly, vertical wall portions of polycrystal silicon can be obtained on the sides of the gate electrode 4.

Figure 18C:
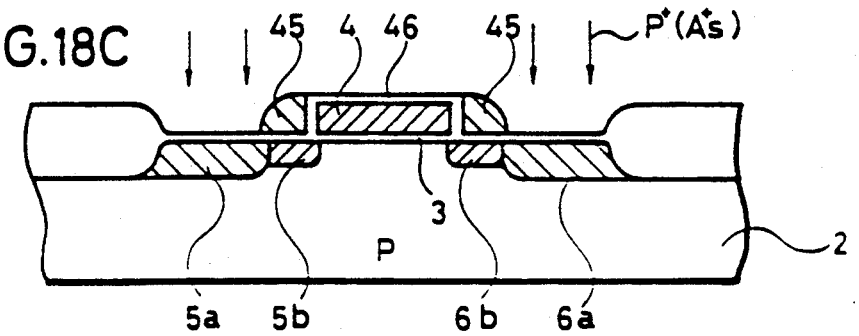

Referring to FIG. 18C, the polycrystal silicon layer 45a is anisotropically etched to be left only on the sidewalls of the gate electrode 4. Thereafter, using the gate electrode 4 and the conductive sidewall spacers 45 and 45 as masks, relatively high-concentration ($10^{19}-10^{21}$ cm$^{-3}$) arsenic or phosphor is implanted to form n$^+$ impurity regions 5a and 6a.

Figure 18D:
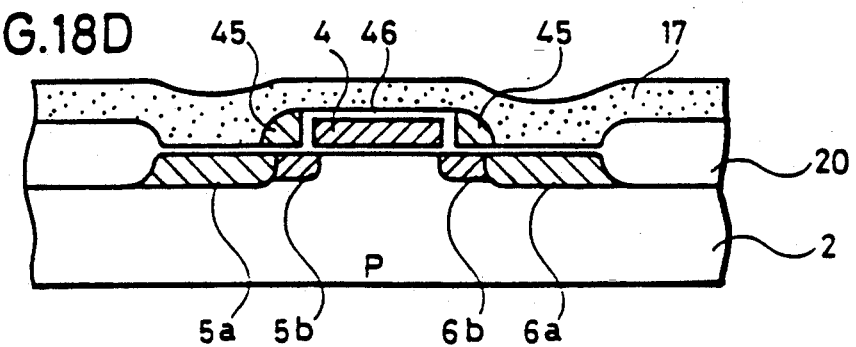
Figure 18E:
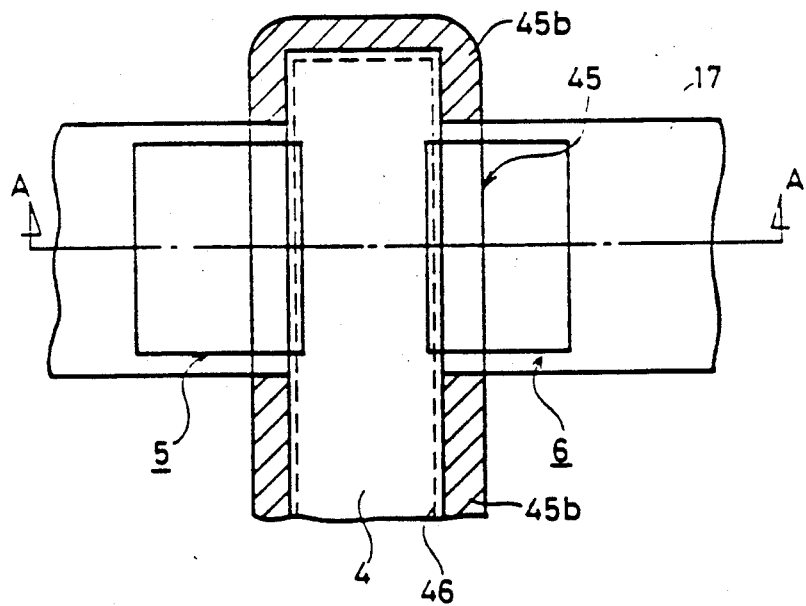
Figure 19:
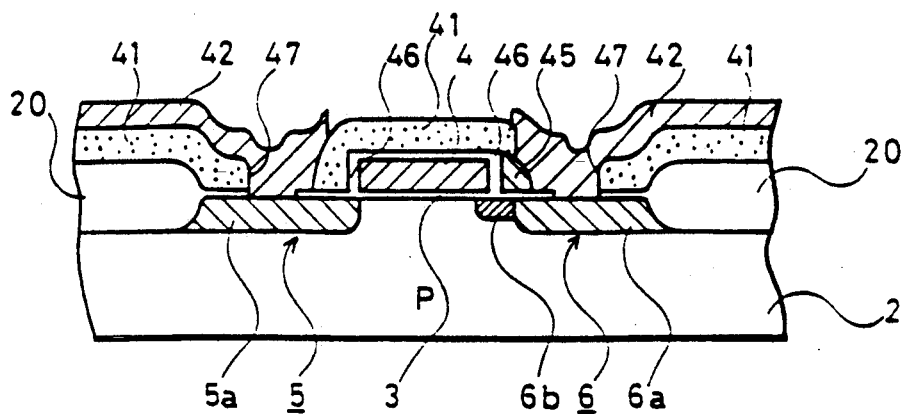
FIG. 19 is a sectional structural view of the LDD MOS transistor according to the eighth embodiment of the present invention.

Referring to FIGS. 18D through 18E, predetermined regions of the conductive sidewall spacers 45 and 45 are etched to prevent short-circuit of interconnection for the source and drain electrodes. More specifically, the surface of the p-type silicon substrate 2 is covered with resist 17 to be patterned into a predetermined form. FIG. 18E shows a patterned resist pattern. Regions 45b of the conductive sidewall spacer 45 shown with hatching lines are not covered with the resist 17. In this state, the exposed regions 45b of the conductive sidewall spacer 45 are etched by an anisotropical etching with fluorine containing gas, halogen containing gas or alkaline solutions such as KOH.

Thereafter, impurity regions of the p-type semiconductor substrate are activated by thermal process. In addition, CVD oxide films 41 are deposited over the whole surface of the substrate to form contact holes 47. The contact holes 47 are formed such that part of the upper surfaces of the source and drain regions 5 and 6 and conductive sidewall spacers 45 are exposed therein. Then, aluminum layers are deposited in the contact holes 47 and on the surface of the CVD oxide films 41 to be patterned, thereby forming connection layers 42 and 42. Manufacturing of MOS transistor having an LDD structure is accomplished by the above described steps.

An eighth embodiment of the present invention will be described in reference to FIG. 19 and FIGS. 20A through 20C. This embodiment is a modified example of the above seventh embodiment. More specifically, referring to FIG. 19, the MOS transistor according to the present embodiment has an LDD structure only on a side of its drain region 6, and conductive sidewall spacer 45 is formed only on a sidewall of a drain side of a gate electrode 4. Such a structure is formed taking account into the fact that various problems due to hot carriers mainly occur on a drain side.

Figure 20A:
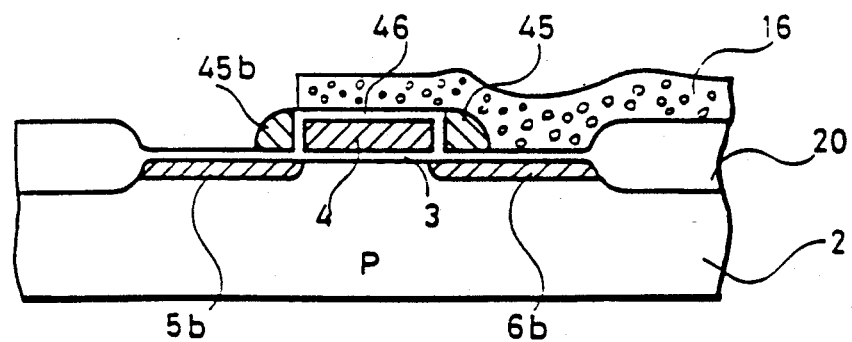
Figure 20B:
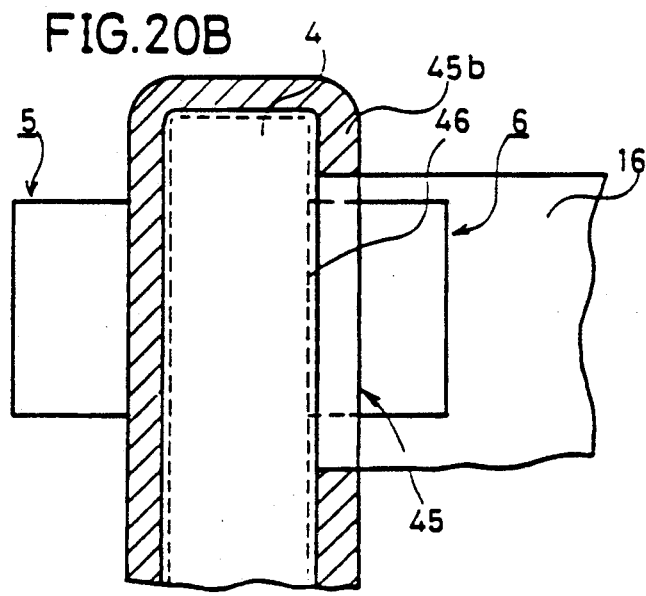

In the present embodiment, manufacturing processes are the same as those shown in the above FIGS. 18a and 18B. Thereafter, referring to FIG. 20A, a conductive sidewall spacer 45 of polycrystal silicon is formed on a sidewall of the gate electrode 4 through an insulating film 46. Then, predetermined regions of the conductive sidewall spacer 45 are etched, which is to prevent short-circuit between source an drain electrodes. In the present embodiment, a resist pattern 16 is formed to cover the sidewall spacer 45 located on the drain side of the sidewall of the gate electrode 4. More specifically, a sidewall spacer 45b located on the source side of the gate electrode 4 is exposed, and which is shown in FIG. 20B as a plan view. Then, using the resist pattern 16 as a mask, the exposed region 45b of the conductive sidewall spacer 45 is etched.

Figure 20C:
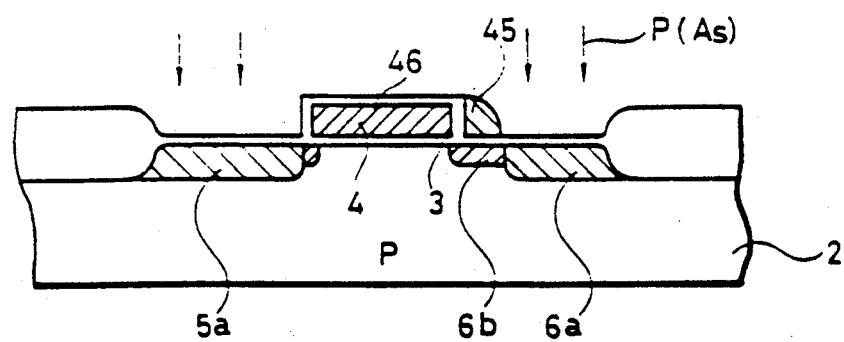

Referring to FIG. 20C, further using the gate electrode 4 covered with the insulating film 46 and the conductive sidewall spacer 45 formed on the drain side as masks, impurity ion of high-concentration phosphor or arsenic is implanted into the p-type silicon substrate 2 to n$^+$ impurity regions 5a and 6a.

Thereafter, a thermal process is performed to activate impurity ion injected into the p-type silicon substrate. Then, after formation of interlayer insulating films 41, contact holes and connection layers, manufacturing a MOS transistor is accomplished.

Figure 21:
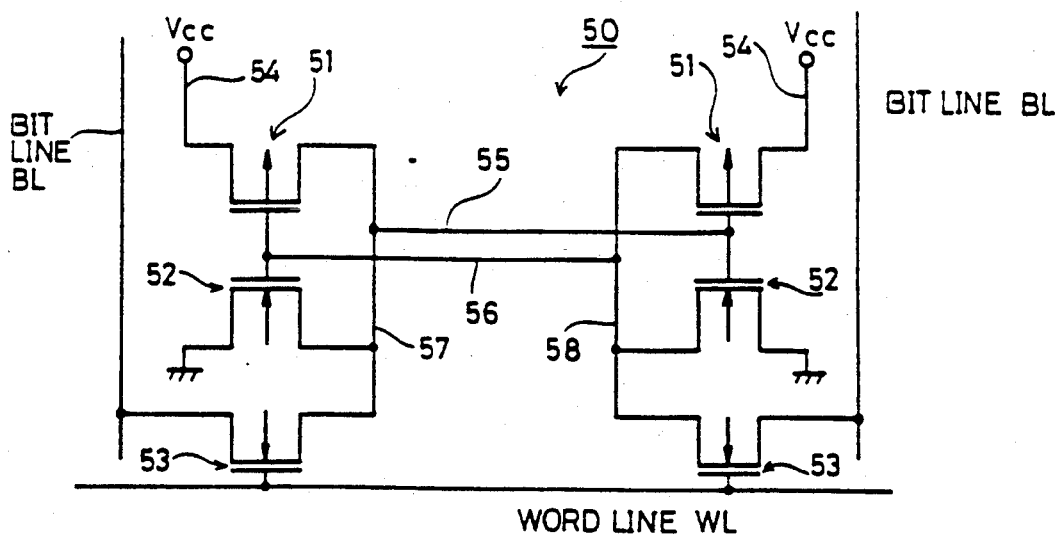
FIG. 21 is an equivalent circuit diagram of a memory cell of CMOS static RAM.
Figure 22:
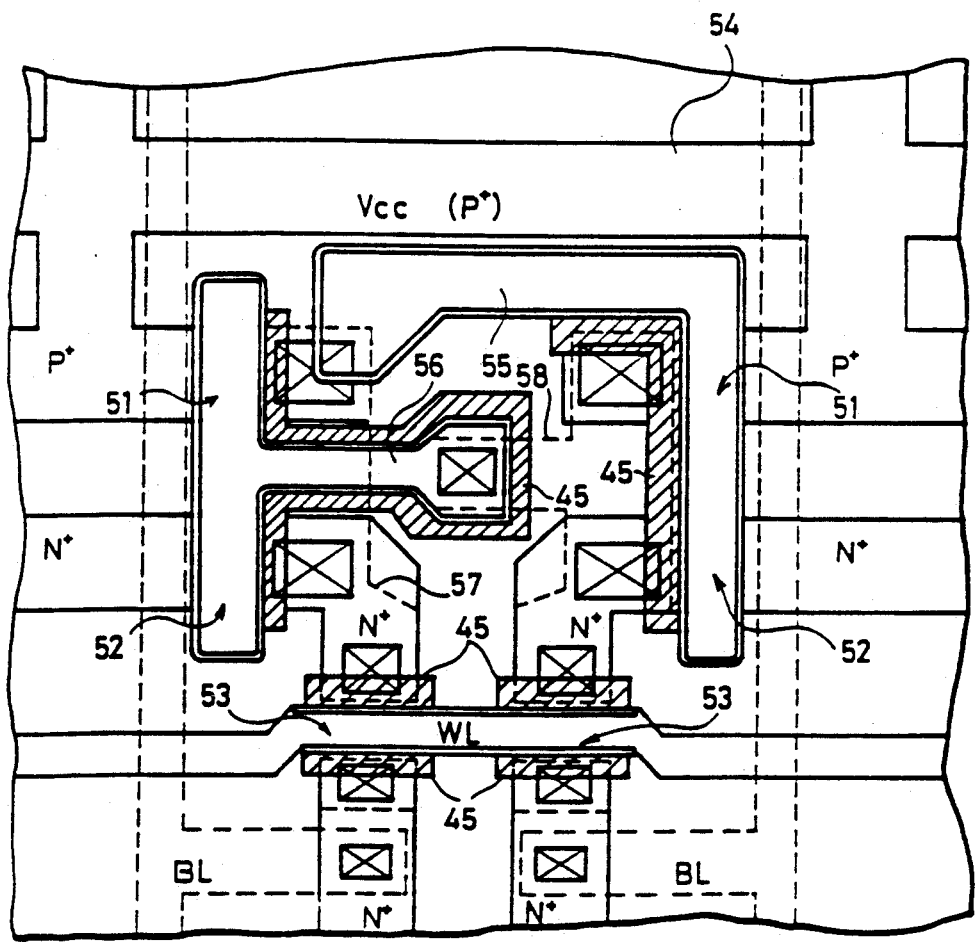
FIG. 22 is a plan structural view of the memory cell of the static RAM shown in the equivalent circuit diagram of FIG. 21.

Now, a memory cell structure of a CMOS static RAM according to a ninth embodiment of the present invention will be described. A memory cell of the CMOS static RAM comprises the MOS transistor according to the above seventh and eighth embodiments. Referring to FIGS. 21 and 22, a memory cell 50 comprises a pair of load transistors 51 and 51, driver transistors 52 and 52, and transfer gate transistors 53 and 53. The load transistor comprises p MOS transistors, while each of the driver transistor 52 and the transfer gate transistor 53 comprises n MOS transistors. Respective MOS transistors constitute a flip-flop circuit such as shown in an equivalent circuit diagram of FIG. 21 by means of connection layers 54, 55, 56, 57 and 58. In the load transistor 51 and the driver transistor 52, a conductive sidewall spacer 45 is formed only on a sidewall of the drain side of a gate electrode. In the transfer gate transistor 53, conductive sidewall spacers 45 are formed on both sidewalls of the gate electrode, because current of the transfer gate transistor 53 flows bidirectionally so that LDD structure and conductive sidewall spacers 45 are necessary on both sides of the gate electrode. The conductive sidewall spacers 45 are in contact with the source and drain electrodes connection layers.

Figure 23:
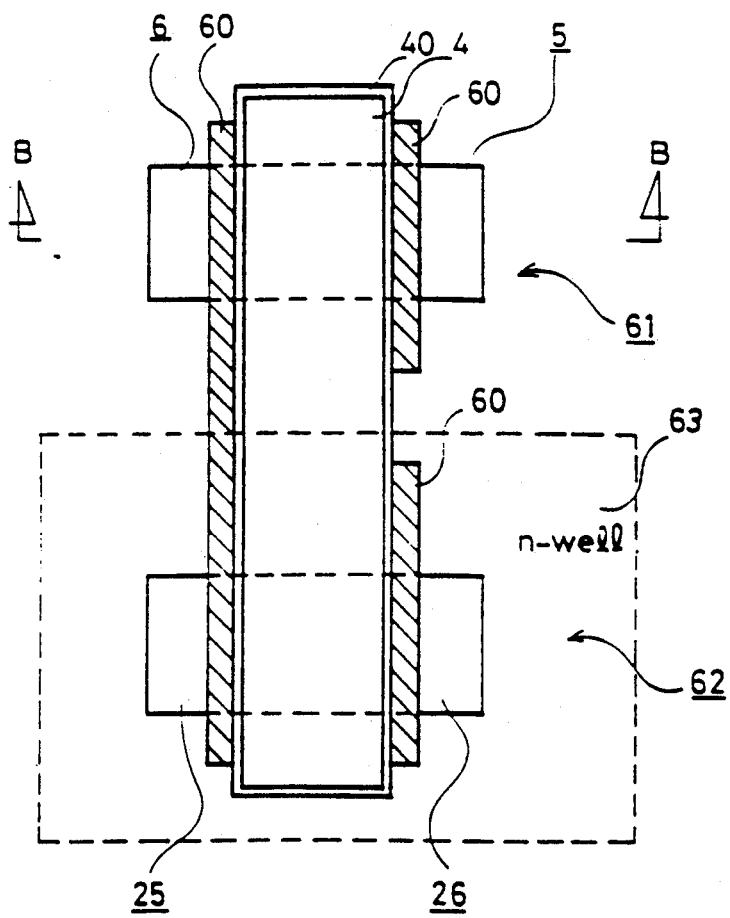
FIG. 23 is a plan structural view of a CMOS inverter circuit comprising the LDD MOS transistor according to the tenth embodiment of the present invention.
Figure 24:
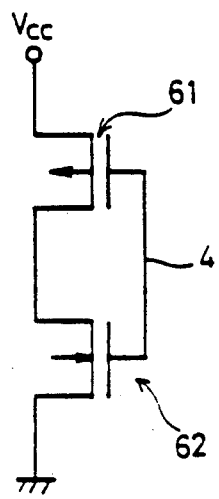
FIG. 24 is an equivalent circuit diagram of the CMOS inverter circuit of FIG. 23.
Figure 25:
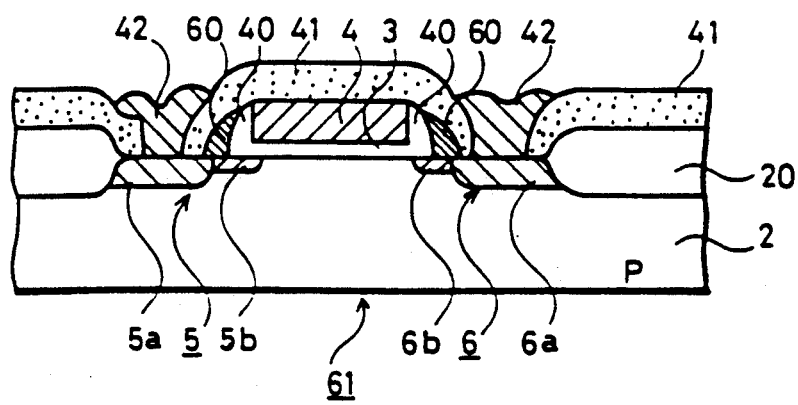
FIG. 25 is a sectional structural view taken along the line B—B in FIG. 23.

An embodiment of FIG. 10 of the present invention will be described with reference to FIGS. 23, 24, 25 and 26A through 26C. The MOS transistor shown in this example constitutes a CMOS inverter circuit in which an n MOS transistor 61 and a p MOS transistor 62 are connected with each other. Referring to FIGS. 23 and 24, an n well region 63 is formed in the p-type silicon substrate 2. A p MOS transistor 62 is formed in the n well region 63, and an n MOS transistor 61 is formed on a surface of the p-type silicon substrate 2 adjacent to the n well region 63. Gate electrodes of the n MOS transistor 61 and the p MOS transistor 62 continuously extend in a fixed direction. Conductive sidewall spacers 60 are formed through insulating film sidewall spacers 40 on the sidewalls of the gate electrode 4. Referring to FIG. 25, the conductive sidewall spacers 60 are directly connected with the surfaces of the source and drain regions 5 and 6, thereby connecting the source and drain regions 5 and 6 of the n MOS transistor 61 and the p MOS transistor 62 adjacent to each other in a predetermined relation. The n MOS transistor 61 is the LDD structure of the n⁻ impurity regions 5b and 6b and the n⁺ impurity regions 5a and 6a. Taking out hot carriers through the conductive sidewall spacers 60 solves a problem caused by hot carriers generated near the drain region due to direct connection of the conductive sidewall spacers 60 to the source and drain regions 5 and 6. At the same time, the conductive sidewall spacers 60 function as connection layers. Therefore, there is no need of an additional interconnection. The conductive sidewall spacer 60 has an advantage of being formed in a fine configuration in a self-alignement manner, so that miniaturized structure of device can be implemented.

A method of manufacturing the CMOS semiconductor circuit shown in FIGS. 23 through 25 will be explained in the following with reference to FIGS. 26A through 26G.

FIGS. 26A through 26C and 26F show sectional structures of the n MOS transistor 61 taken along the line B—B in FIG. 23.

Figure 26A:
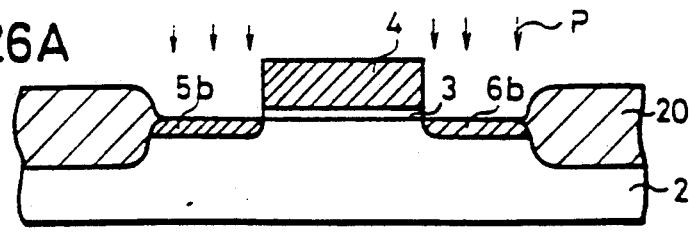
FIGS. 26A through 26G are sectional views showing steps of a method of manufacturing the CMOS inverter circuit shown in FIG. 23.

Referring to FIG. 26A, an n well region 63 (refer to FIG. 23) is formed in the p type silicon substrate 2, and field oxide films 20 are formed in predetermined regions. A gate insulating film 3 and a gate electrode 4 of polycrystal silicon are sequentially formed on the surface of the p-type silicon substrate 2. Thereafter, after covering a region of the p MOS transistor 62 (n well region 63) with resist, using a gate electrode 4 formed in a region of the n MOS transistor 61 as a mask, about $1 \times 10^{13}$ cm$^{-2}$ of phosphor ion is implanted into the p-type silicon substrate by implantation energy 30 keV, thereby forming n⁻ impurity regions 5b and 6b of the n MOS transistor 61. In addition, after removal of the resist on the region of the p MOS transistor 62, the region of the n MOS transistor is covered with resist. Then, using the gate electrode 4 of the p MOS transistor 62 as a mask, about $1 \times 10^{13}$ cm$^{-2}$ of boron is implanted by implantation energy 30 keV, thereby forming p⁻ impurity regions (not shown) of the p MOS transistor 62.

Figure 26B:
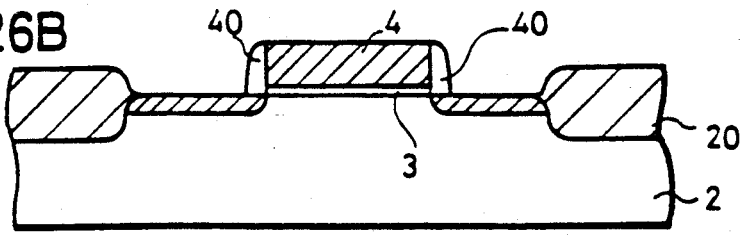

Referring to FIG. 26B, about 500Å thickness of silicon oxide film is deposited over the whole surface of the p-type silicon substrate 2 by LPCVD. In addition, by RIE anisotropical etching of the silicon oxide film, oxide films 40 and 40 are left only on the sidewalls of the gate electrodes 4 and 4, thereby forming insulating film sidewall spacers 40 and 40.

Figure 26C:
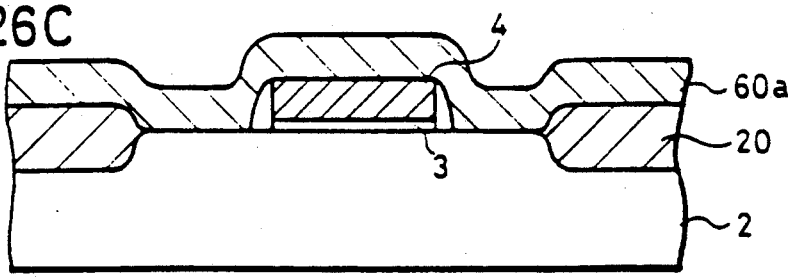

Referring to FIG. 26C, about 3000Å thickness of polycrystal silicon layer 60a is deposited on the whole surface of the substrate by LPCVD method.

Figure 26D:
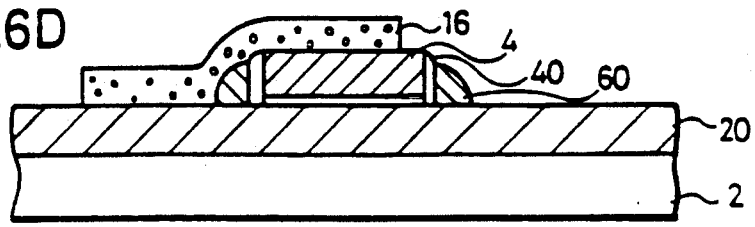

Referring to FIG. 26D, the polycrystal silicon layer 60a is etched by means of RIE anisotropical etching to form conductive sidewall spacers 60 and 60 of polycrystal silicon on the sidewalls of the gate electrodes 4 through insulating film sidewall spacers 40 and 40.

Figure 26E:
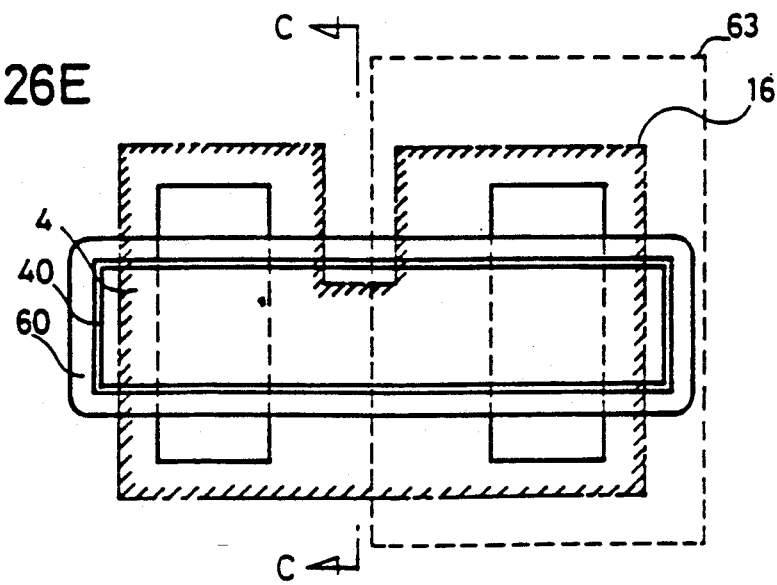

A resist pattern 16 of a predetermined form is formed on the surface of the p-type silicon substrate 2. As shown in FIG. 26E, in the resist pattern 16, conductive sidewall spacers 60 are separately formed on the respective sidewalls of the gate electrodes of the n MOS transistor 61 and the p MOS transistor 60, while respective conductive sidewall spacers 60 extending on one of sidewalls of the gate electrode 4 of the n MOS transistor 60 and the p MOS transistor 62 are separately formed from each other.

Figure 26F:
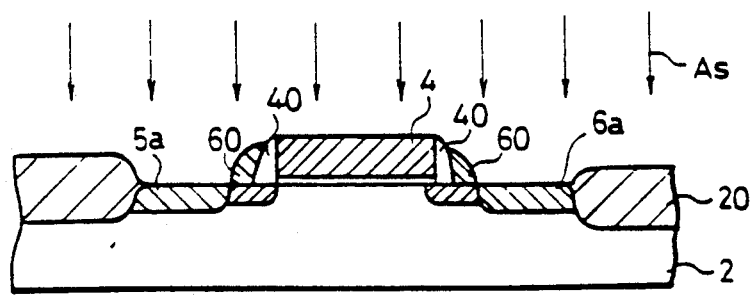
Figure 26G:
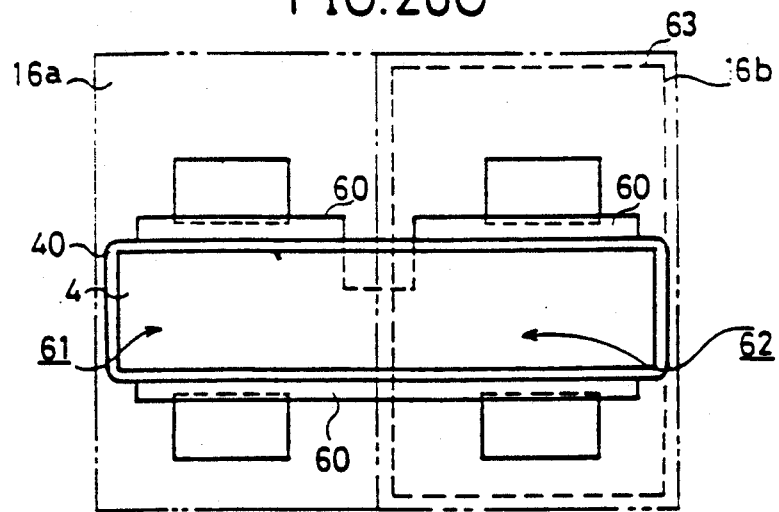

Referring to FIGS. 26F and 26G, after the removal of the resist pattern 16, the region of the p MOS transistor 62 is covered with a resist 16b. Then, using the gate electrode 4, the conductive sidewall spacers 60 and 60 as masks, $4 \times 10^{15}$ cm$^{-2}$ of, for example, arsenic ion is implanted into the p-type silicon substrate by implantation energy 50 keV, thereby forming n⁺ impurity regions 5a and 6a self-aligned with the conductive sidewall spacers 60. Next, the region of the n MOS transistor 61 is covered with other resist pattern 16a. Then, using the gate electrode 4 and conductive sidewall spacers 60 and 60 of the p MOS transistor 62 as masks, $1 \times 10^{15}$ cm$^{-2}$ of boron ion is implanted by implantation energy 30 keV, thereby forming p⁺ impurity regions 25a and 26a in the n well region 63. FIG. 26G shows plan regions covered with respective resist patterns 16a and 16b.

Thereafter, impurities in the p-type silicon substrate are activated by a thermal process. Then, by forming interlayer insulating films 41, contact holes in predetermined regions, and further forming aluminum connection layers 42 and 42, manufacturing process is finished.

An ion implantation into low-concentration impurity regions such as shown in FIG. 26A can be omitted in an modified example of the present invention. In this case, each source and drain structure of the n MOS transistor 61 and the p MOS transistor 62 can be a single layer structure.

Figure 27:
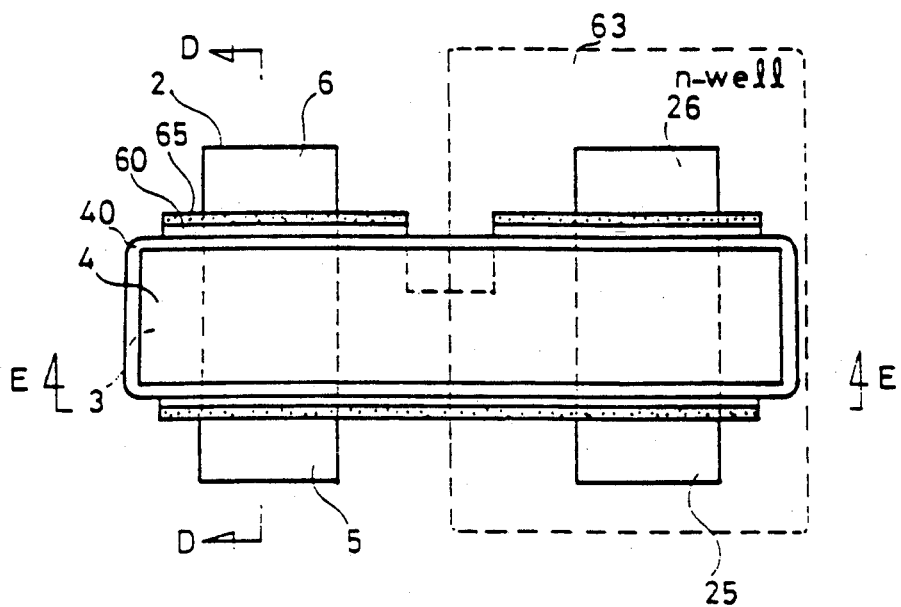
FIG. 27 is a plan structural view of a CMOS inverter circuit according to the eleventh embodiment of the present invention.

An eleventh embodiment of the present invention will be described with reference to FIGS. 27, 28 and 29. The present embodiment is a modified example of the CMOS inverter circuit according to the above tenth embodiment. More specifically, referring to FIG. 28, silicide layers 65 of high melting metal such as titanium (Ti) and tungsten (W) is further formed on sidewalls of the conductive sidewall spacers 60 of polycrystal silicon serving as connection layers. A function of the silicide layers 65 will be described with reference to FIG. 29. More specifically, the conductive sidewall spacers 60 formed on the sidewalls of the gate electrode 4 extend between two different conductive-type transistors. Accordingly, n-type impurities are injected into a portion where the MOS transistor 61 is formed, while p-type impurities are injected into a portion where the p MOS transistor 62 is formed. Accordingly, a pn junction is formed in a boundary region indicated as A. On the other hand, the silicide layers 65 are formed continuously along the sidewalls of the conductive sidewall spacers 60 in which different conductive-type of impurities are injected, thereby bypassing the pn junction formed in the conductive sidewall spacers 60 to implement excellent ohmic contact.

Figure 28:
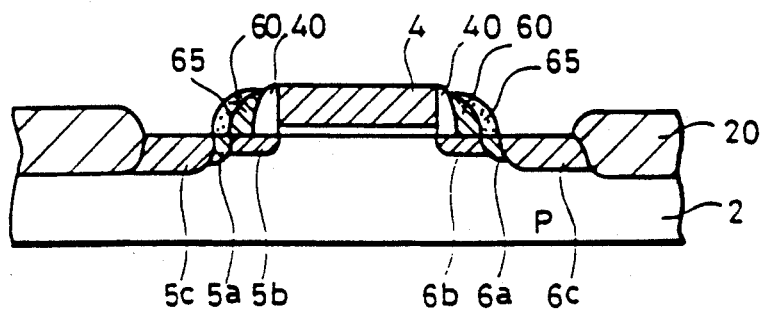
FIG. 28 is a sectional structural view taken along the line D—D in FIG. 27.
Figure 29:
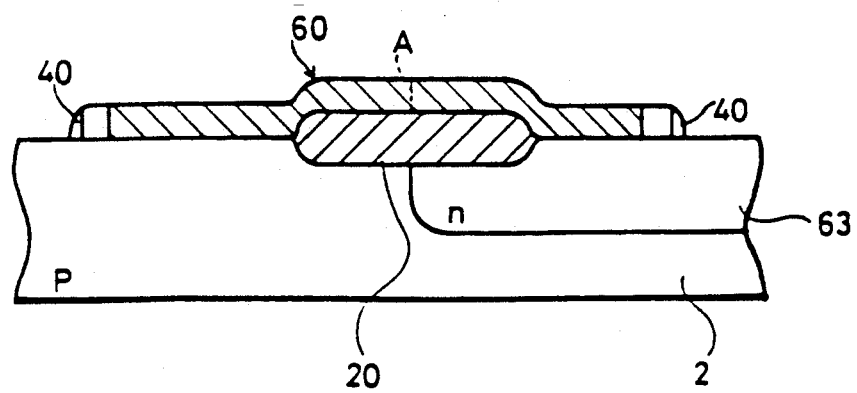
FIG. 29 is a sectional structural view taken along the line E—E in FIG. 27.

As another modified examples, as shown in FIG. 28, using the silicide layers 65 as a mask, impurity ion may be implanted into the p-type silicon substrate 2 to constitute the LDD structure of three layers, each of which having different concentrations.

Figure 30A:
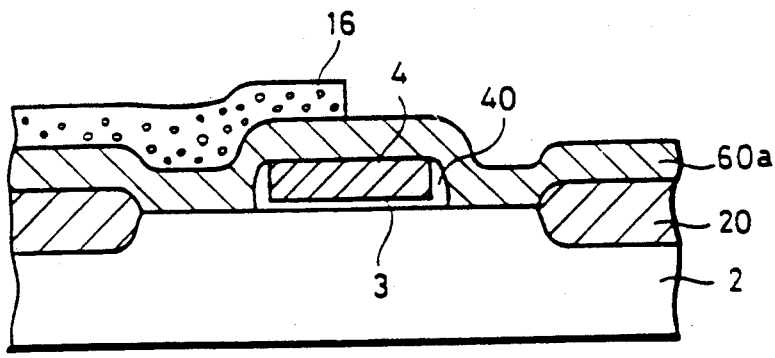
FIGS. 30A and 30B are sectional structural views showing a main part of steps of manufacturing an MOS transistor according to the twelfth embodiment of the present invention.

Now, a twelfth embodiment of the present invention will be described with reference to FIGS. 30A and 30B. The present embodiment is a modified example of the above tenth embodiment. More specifically, although in the tenth embodiment, interconnections are formed using conductive sidewall spacers 60 on sidewall of the gate electrode, in the present embodiment, part of polycrystal silicon layers constituting the conductive sidewall spacers 60 are patterned into a connection configuration to be left, thereby constituting a connection structure by using the patterned interconnection layers and conductive sidewall spacers 60 formed on the sidewalls of the gate electrode. More specifically, referring to FIG. 30A, a polycrystal silicon layer 60a is formed on the surface of the p-type silicon substrate 2. Then, a resist pattern 16 of a predetermined form is formed on the upper surface of the polycrystal silicon layer 60a.

Figure 30B:
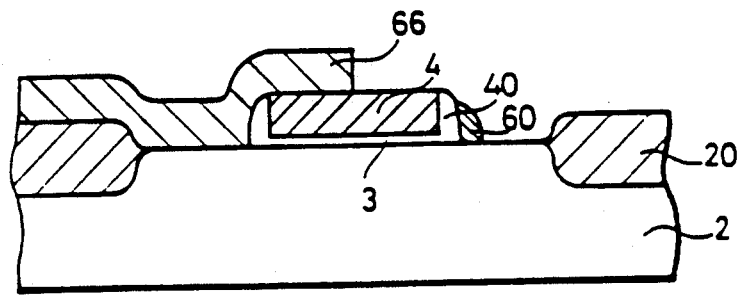

Referring to FIG. 30B, using the resist pattern 16 as a mask, the polycrystal silicon layer 60a is etched, thereby forming conductive sidewall spacers 60 on the sidewalls of the gate electrode 4. In addition, a connection pattern 66 directly connected with the upper surface of the gate electrode 4 is simultaneously formed. The interconnection pattern 66 is connected with a predetermined region of other device region. These steps nearly correspond to those shown in FIGS. 26C and 26D described in the tenth embodiment.

Figure 31:
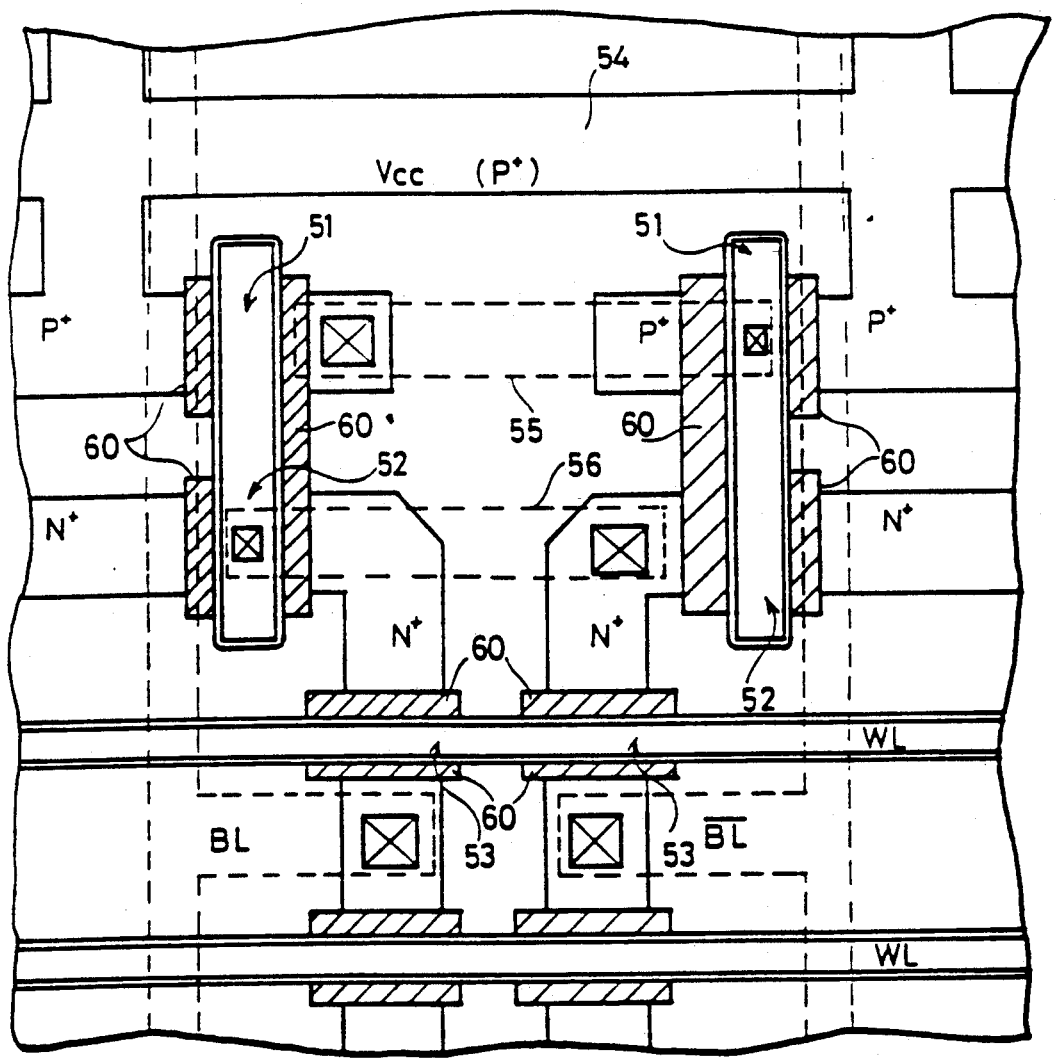
FIG. 31 is a plan structural view of the memory cell of CMOS static according to the thirtieth embodiment of the present invention.
Figure 32:
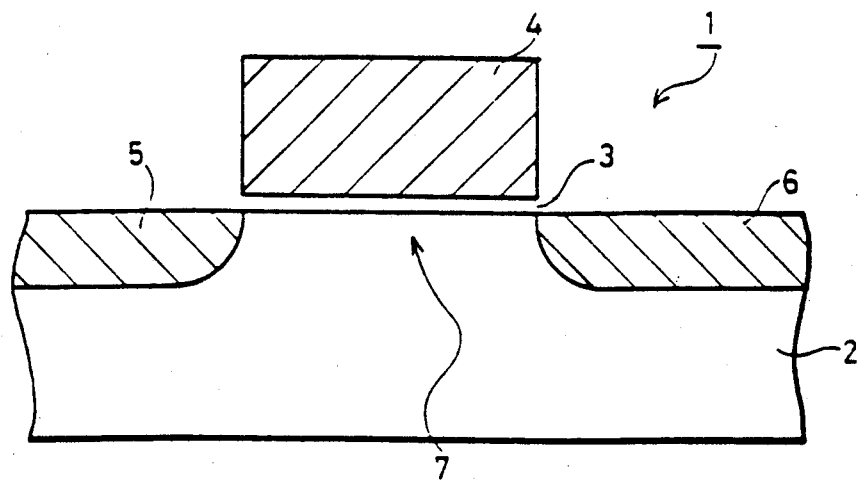
FIG. 32 is a sectional structural view of a conventional general MOS transistor.
Figure 33:
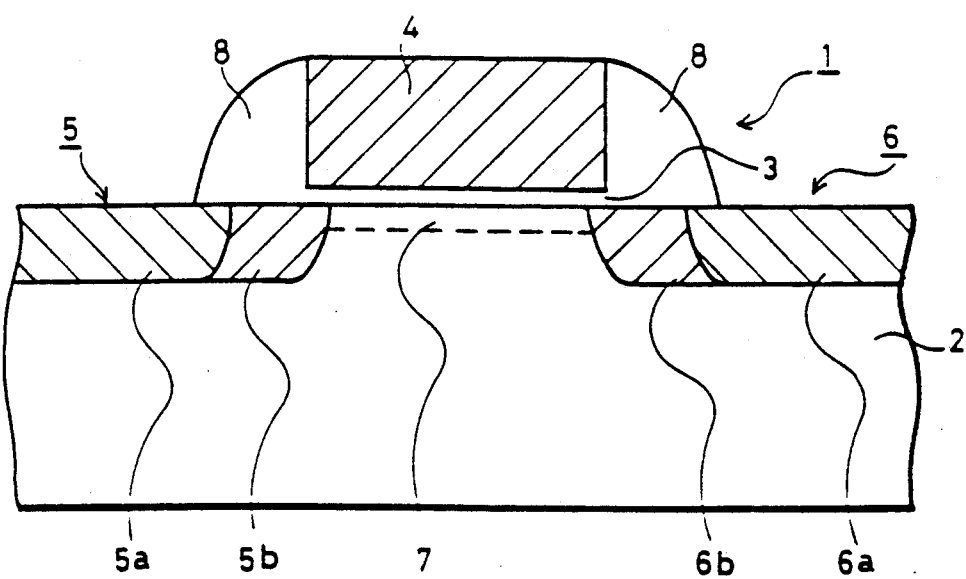
FIG. 33 is a sectional structural view showing an example of a conventional LDD MOS transistor.
Figure 34:
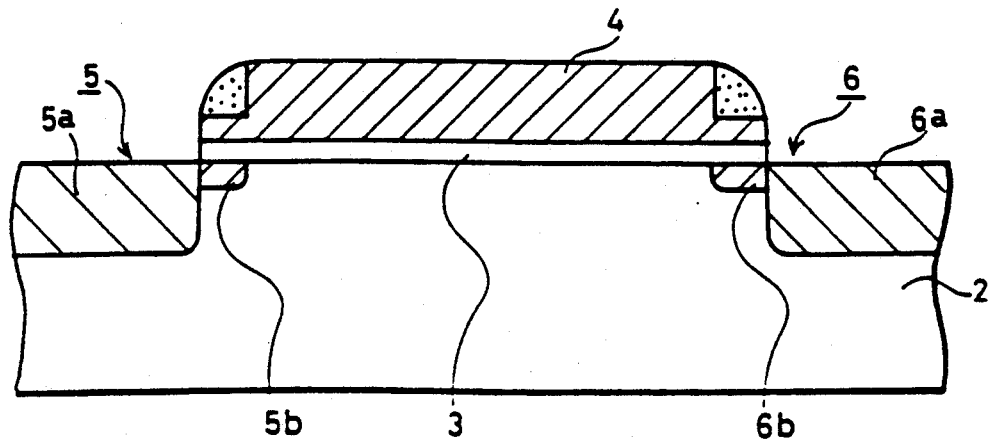
FIG. 34 is a sectional structural view showing another example of a conventional LDD MOS transistor.

Now, a thirteenth embodiment of the present invention will be described with reference to FIG. 31. In this embodiment, the MOS transistor structure according to the tenth embodiment is applied to a memory cell structure of the CMOS static RAM. The foregoing FIG. 21 shows an equivalent circuit diagram of the memory cell structure shown in FIG. 31. Referring to FIG. 31, each of load transistors 51, driver transistors 52 and transfer gate transistors 53 forming a memory cell has conductive sidewall spacers 60 on sidewalls of their gate electrodes. In addition, source and drain regions of the load transistor 51 and the driver transistor 52 are connected to each other through the conductive sidewall spacers 60. By using the sidewall spacers 60 as an interconnection, area of interconnection region can be reduced to improve the degree of integration of a memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an MIS device, comprising the steps of:
    forming a first insulating film on a semiconductor substrate;
    forming a first conductive layer on said first insulating film;
    coating resist on said first conductive layer and selectively removing said resist to form a mask pattern;
    patterning said first conductive layer and said first insulating film by using said mask pattern;
    implanting impurity for forming impurity regions of a relatively low concentration in said semiconductor substrate by using said patterned portions as masks;
    forming a nitride film on surfaces of said insulating film including surfaces of said first conductive layer;
    anisotropically etching said nitride film, leaving said nitride film only on sidewalls of said first conductive layer;
    applying a thermal oxidation process by using said nitride film and said first conductive layer as masks, and forming a second insulating film having a thickness larger than that of said first insulating film on a surface of said semiconductor substrate not covered with said first conductive layer;
    removing said nitride film and forming a second conductive layer on surfaces of said second insulating film including surfaces of said first conductive layer,
    etching said second conductive layer, leaving said second conductive layer only on the sidewalls of said first conductive layer; and
    implanting impurity for forming impurity regions of a relatively high concentration in said semiconductor substrate by using said first and second conductive layers as masks.

2. A manufacturing method in accordance with claim 1 further comprising the step of forming a third insulating film on said first conductive layer after the steps of forming said first insulating film and said first conductive layer on said semiconductor substrate.

3. A manufacturing method in accordance with claim 1, wherein said second conductive layer is left only on the sidewalls of said first conductive layer by anisotropic etching.

4. A manufacturing method in accordance with claim 1, further comprising the step of forming an oxide film on a surface of said first conductive layer, an end of etching of said second conductive layer being detected by using said oxide film.

* * * * *